US011322594B2

(12) United States Patent
Ma et al.

(10) Patent No.: US 11,322,594 B2
(45) Date of Patent: May 3, 2022

(54) SEMICONDUCTOR DEVICE INCLUDING A LATERAL INSULATOR

(71) Applicant: Texas Instruments Incorporated, Dallas, TX (US)

(72) Inventors: Fei Ma, Chengdu (CN); Ya ping Chen, Chengdu (CN); Yunlong Liu, Chengdu (CN); Hong Yang, Richardson, TX (US); Shengpin Yang, SiChuan (CN); Baoqiang Niu, Chengdu (CN); Rui Liu, Si Chuan (CN); Zhi Peng Feng, SiChuan (CN); Seetharaman Sridhar, Richardson, TX (US); Sunglyong Kim, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/134,706

(22) Filed: Dec. 28, 2020

(65) Prior Publication Data
US 2022/0052165 A1    Feb. 17, 2022

Related U.S. Application Data

(63) Continuation of application No. PCT/CN2020/108857, filed on Aug. 13, 2020.

(30) Foreign Application Priority Data

Aug. 13, 2020 (WO) ................ PCT/CN2020/108857

(51) Int. Cl.
*H01L 29/40* (2006.01)
*H01L 29/78* (2006.01)
(Continued)

(52) U.S. Cl.
CPC .......... *H01L 29/407* (2013.01); *H01L 21/765* (2013.01); *H01L 21/823487* (2013.01);
(Continued)

(58) Field of Classification Search
CPC ............. H01L 27/2454; H01L 29/7827; H01L 29/7813; H01L 29/4236; H01L 29/66734; H01L 29/407; H01L 21/823487
See application file for complete search history.

(56) References Cited

U.S. PATENT DOCUMENTS

| 10,686,058 B2 * | 6/2020 | Cai ..................... H01L 29/4236 |
| 2010/0123193 A1 * | 5/2010 | Burke .................. H01L 27/088 257/334 |

(Continued)

FOREIGN PATENT DOCUMENTS

| CN | 101740394 A | 6/2010 |
| CN | 101785091 A | 7/2010 |

(Continued)

OTHER PUBLICATIONS

Search Report for Application No. PCT/CN2020/108857, dated May 12, 2021.

*Primary Examiner* — Joseph C. Nicely
(74) *Attorney, Agent, or Firm* — Andrew R. Ralston; Charles A. Brill; Frank D. Cimino

(57) ABSTRACT

A semiconductor device, and methods of forming the same. In one example, the semiconductor device includes a trench in a substrate having a top surface, and a shield within the trench. The semiconductor device also includes a shield liner between a sidewall of the trench and the shield, and a lateral insulator over the shield contacting the shield liner. The semiconductor device also includes a gate dielectric layer on an exposed sidewall of the trench between the lateral insulator and the top surface. The lateral insulator may have a (Continued)

minimum thickness at least two times thicker than a maximum thickness of the gate dielectric layer.

20 Claims, 25 Drawing Sheets

(51) Int. Cl.
    *H01L 29/66*     (2006.01)
    *H01L 21/765*     (2006.01)
    *H01L 29/423*     (2006.01)
    *H01L 27/24*     (2006.01)
    *H01L 21/8234*     (2006.01)

(52) U.S. Cl.
    CPC ........ *H01L 27/2454* (2013.01); *H01L 29/408* (2013.01); *H01L 29/4236* (2013.01); *H01L 29/66734* (2013.01); *H01L 29/7813* (2013.01); *H01L 29/7827* (2013.01)

(56) References Cited

U.S. PATENT DOCUMENTS

| | | | | |
|---|---|---|---|---|
| 2010/0264486 | A1* | 10/2010 | Denison | H01L 29/407 |
| | | | | 257/330 |
| 2013/0302958 | A1* | 11/2013 | Hossain | H01L 29/4916 |
| | | | | 438/270 |
| 2014/0015039 | A1* | 1/2014 | Hossain | H01L 29/7813 |
| | | | | 257/330 |
| 2018/0114857 | A1* | 4/2018 | Okada | H01L 21/28194 |
| 2020/0044078 | A1 | 2/2020 | Yilmaz et al. | |
| 2020/0075758 | A1 | 3/2020 | Chien et al. | |
| 2020/0212218 | A1* | 7/2020 | Kim | H01L 29/404 |
| 2020/0312710 | A1* | 10/2020 | Yang | H01L 21/02164 |

FOREIGN PATENT DOCUMENTS

| | | | |
|---|---|---|---|
| CN | 105355560 A | 2/2016 | |
| CN | 106298949 A | 1/2017 | |
| CN | 107710418 A | 2/2018 | |
| WO | WO-2009026174 A1 * | 2/2009 | ......... H01L 29/7813 |

* cited by examiner

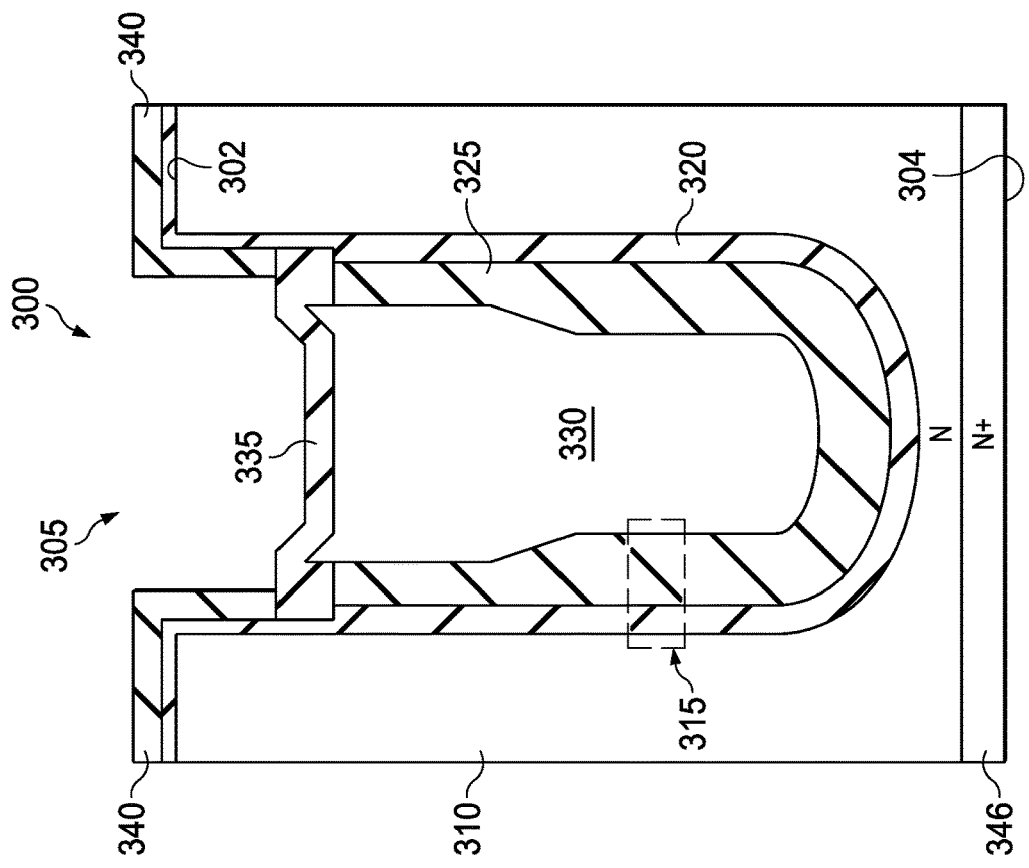
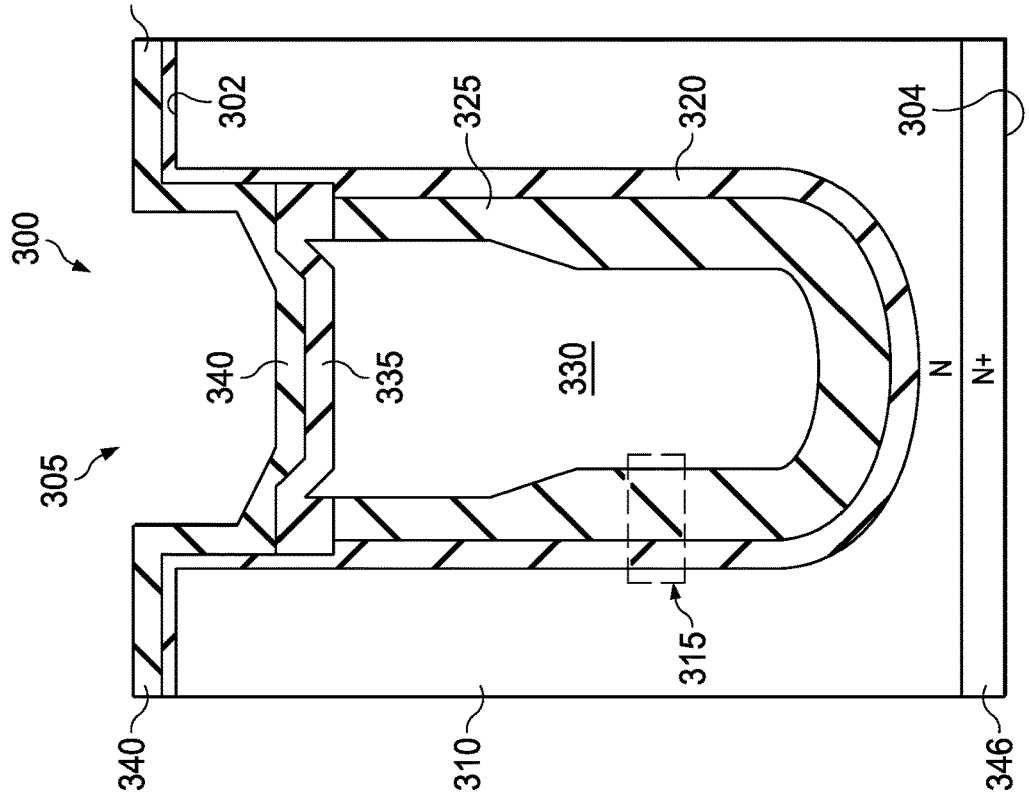
FIG. 3I
FIG. 3H

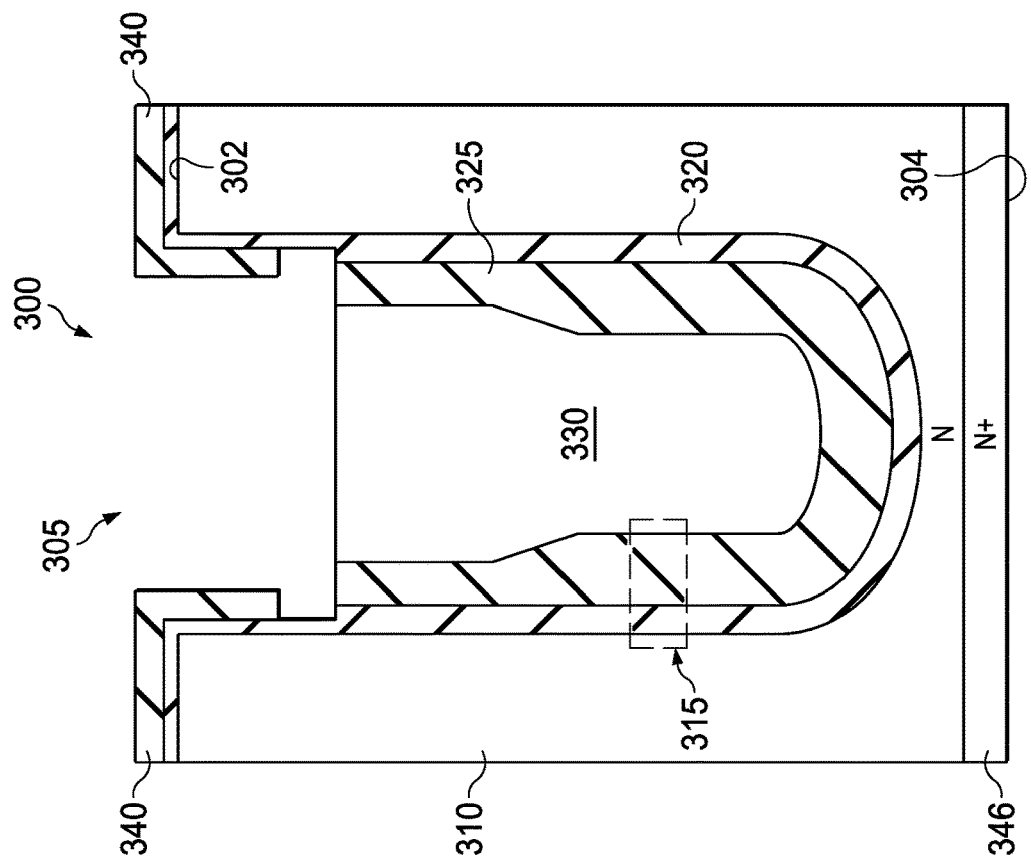
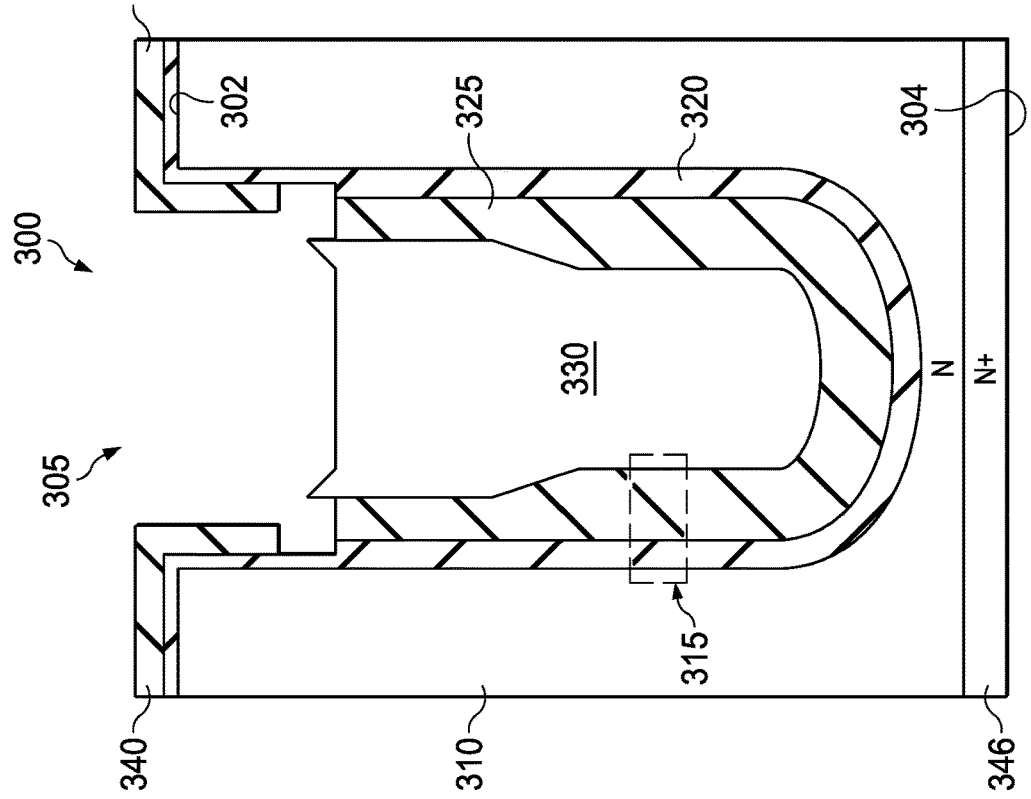

SEMICONDUCTOR DEVICE INCLUDING A LATERAL INSULATOR

TECHNICAL FIELD

The present disclosure is directed, in general, to semiconductor devices and, more specifically, to a semiconductor device including a lateral insulator, and methods of forming the same.

BACKGROUND

Some semiconductor devices include a transistor with a gate in a trench in the semiconductor substrate, and a shield in the trench below the gate. Such a configuration is common in vertical metal oxide semiconductor (MOS) transistors. A portion of the shield extends toward a top of the trench to provide an area for an electrical connection to the shield. Forming the shield and the gate to be electrically isolated from each other has been difficult to achieve in production.

Growing a single layer of a lateral insulator (e.g., gate oxide) directly on the shield (e.g., polysilicon shield) is often insufficient in some designs to provide sufficient gate voltage isolation. As a result, high gate leakage current is observed due to the thin and non-uniform lateral insulator grown on top of the shield. A low level of gate leakage current is generally a design characteristic for semiconductor devices such MOS transistors.

Accordingly, what is needed is a lateral insulator for a semiconductor device, and related method of forming the same, that facilitates low gate leakage current between the gate and shield of the semiconductor device.

SUMMARY OF THE DISCLOSURE

These and other problems are generally solved or circumvented, and technical advantages are generally achieved, by advantageous examples of the present disclosure which includes a semiconductor device including a lateral insulator, and methods of forming the same. In one example, the semiconductor device includes a trench in a substrate having a top surface, and a shield within the trench. The semiconductor device also includes a shield liner between a sidewall of the trench and the shield, and a lateral insulator over the shield contacting the shield liner. The semiconductor device also includes a gate dielectric layer on an exposed sidewall of the trench between the lateral insulator and the top surface. The lateral insulator may have a minimum thickness at least two times thicker than a maximum thickness of the gate dielectric layer.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated that the specific examples disclosed may be readily utilized as a basis for modifying or designing other structures or processes for carrying out the same purposes of the present disclosure. It should also be realized that such equivalent constructions do not depart from the spirit and scope of the disclosure as set forth in the appended claims.

BRIEF DESCRIPTION OF THE DRAWINGS

For a more complete understanding of the present disclosure, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred examples and are not necessarily drawn to scale.

DETAILED DESCRIPTION

The making and using of the examples are discussed in detail below. It should be appreciated, however, that the present disclosure provides many applicable concepts that can be embodied in a wide variety of specific contexts. The specific examples discussed are merely illustrative of specific ways to make and use the disclosure, and do not limit the scope of the disclosure.

The present disclosure will be described with respect to examples in a specific context, namely, a lateral insulator for a semiconductor device, and methods of forming the same. The principles of the present disclosure may be applied to all types of semiconductor devices that would benefit from electrical isolation between layers therein.

Figure 1:
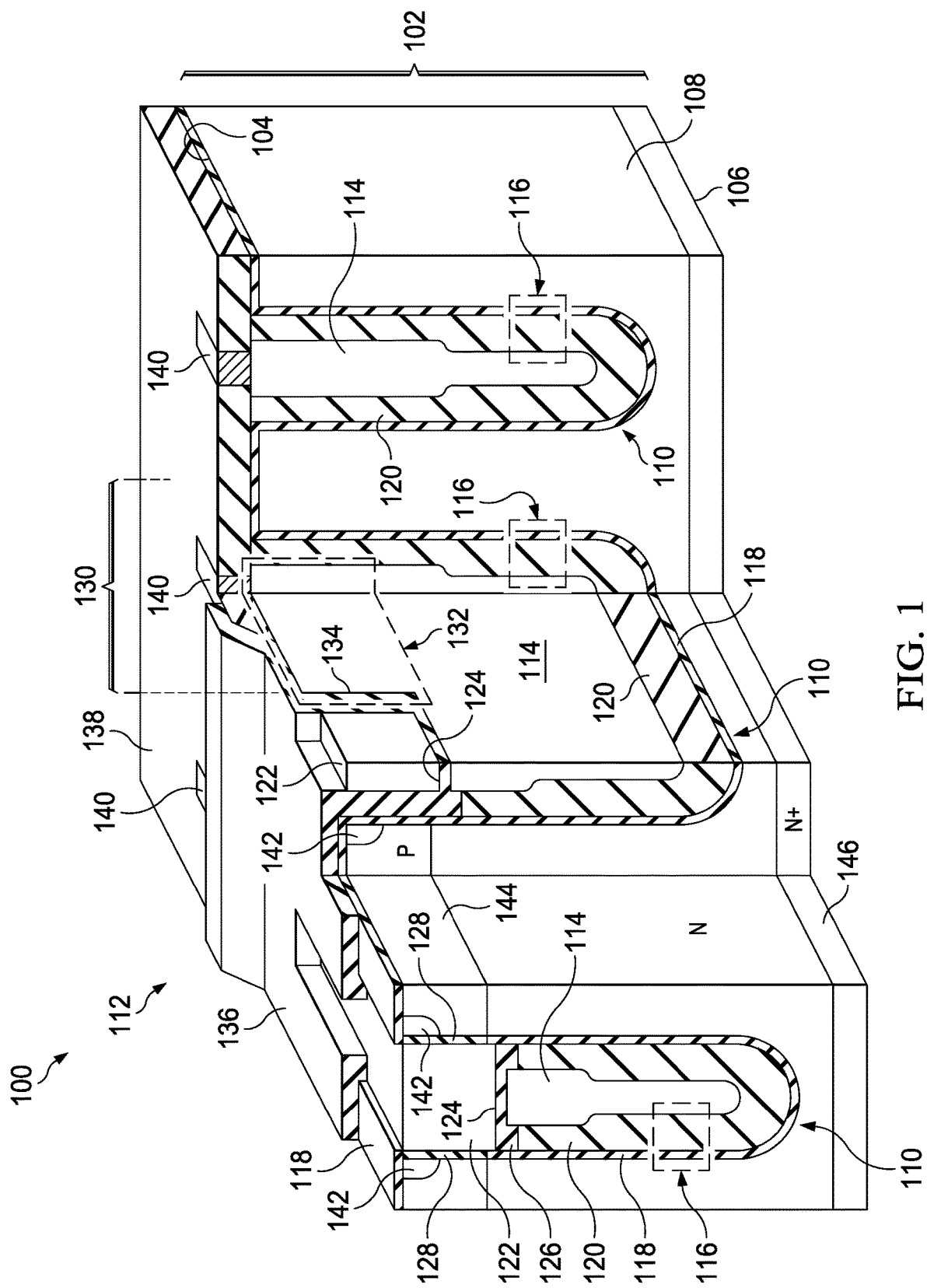
FIG. 1 illustrates a cross-sectional view of an example semiconductor device.

Referring initially to FIG. 1, illustrated is a cross-sectional view of an example semiconductor device 100. The semiconductor device 100 includes a substrate 102 having a top surface 104 and a bottom surface 106, located opposite from the top surface 104. The substrate 102 includes a semiconductor material 108 such as silicon. The semiconductor material 108 may extend from the top surface 104 to the bottom surface 106, as depicted in FIG. 1. The substrate 102 has one or more trenches 110 extending from the top surface 104 into the semiconductor material 108. References in the singular tense include the plural, and vice versa, unless otherwise noted. The trenches 110 may optionally be connected at a point not shown in FIG. 1 to provide a single trench 110. The semiconductor material 108 extends to the trenches 110. The trenches 110 may be 0.5 to 2 micrometers (μm) wide, for example, and may have ratios of depth to width, referred to as aspect ratios, of 3:1 to 10:1, for example.

The semiconductor device 100 includes an MOS transistor 112. The MOS transistor 112 includes a shield (that can be a polysilicon shield) 114 disposed in the trenches 110. The shield 114 is electrically conductive, and may include, for example, polycrystalline silicon, sometimes referred to as polysilicon. The polycrystalline silicon may be doped during deposition, or may be implanted with dopants after deposition, to reduce an electrical resistivity of the shield 114. The shield 114 is separated from the semiconductor material 108 by a shield liner 116 which is electrically non-conductive. In this example, the shield liner 116 may include a first liner 118 (e.g., a first dielectric liner) of thermal silicon dioxide, contacting the semiconductor material 108, and a second liner (e.g., a second dielectric liner) 120 of a deposited dielectric material, contacting the first liner 118. The thermal silicon dioxide in the first liner 118 may be characterized by a stoichiometric composition of silicon dioxide and a hydrogen content less than five atomic percent. The first liner 118 may have a thickness of 20 to 200 nanometers (nm) in the trenches 110, for example. The first liner 118 may optionally extend over the top surface 104 of the substrate 102, as indicated in FIG. 1.

The second liner 120 may include silicon dioxide, and may have an etch rate, in aqueous buffered hydrofluoric acid, that is at least twice an etch rate, in the same aqueous buffered hydrofluoric acid, of the first liner 118. The shield liner 116 may vary in thickness, having a higher thickness proximate to a bottom of the shield 114 than proximate to a top of the shield 114. By way of example, the shield liner 116 may have a thickness of 200 to 400 nm proximate to the bottom of the shield 114, and may have a thickness of 60 to 200 nm proximate to the top of the shield 114. Having a varying thickness of the shield liner 116 may advantageously reduce an electric field in the semiconductor material 108 between the trenches 110 during operation of the MOS transistor 112. In this case, the term "proximate to" is understood in this context to refer to a vertical distance that is less than a lateral width of the trenches 110. The terms "lateral" and "laterally" refer to a direction parallel to the top surface 104 of the substrate 102. The terms "vertical" and "vertically" refer to a direction perpendicular to the top surface 104.

The MOS transistor 112 includes a gate 122 in the trenches 110. The shield 114 extends under the gate 122 in the trenches 110. The gate 122 may include polycrystalline silicon, for example, with appropriate dopants to attain a desired threshold potential during operation of the MOS transistor 112. A gate bottom surface 124 of the gate 122 is separated from the shield 114 by a lateral insulator 126. The lateral insulator 126 may include silicon dioxide, for example. The gate 122 extends to proximate a top of the trenches 110, that is, proximate to the top surface 104 of the substrate 102. Proximate to the top surface 104, in this example, is understood to mean a vertical distance between a top of the gate 122 and the top surface 104 is less than a lateral width of one of the trenches 110. The gate 122 is separated from the semiconductor material 108 by a gate dielectric layer 128, which contacts the gate 122 and the semiconductor material 108.

One or more contact portions 132 of the shield 114 extend toward the top of that trench 110, that is, toward the top surface 104. The contact portions 132 of the shield 114 may be located, for example, at ends 130 of the trenches 110. The contact portion 132 of the shield 114 has an angled surface 134 adjacent to the gate 122 that extends from below the gate bottom surface 124 to proximate to the top of the trench 110. A plane of the angled surface 134 intersects the top surface 104 of the substrate 102 at an angle of 45 degrees to 90 degrees, with 90 degrees being perpendicular to the top surface 104. The angled surface 134 of the contact portion 132 of the shield 114 is separated from the gate 122 by a shield isolation layer 136, which is electrically non-conductive. The shield isolation layer 136 contacts the gate 122 and the angled surface 134 of the contact portion 132 of the shield 114. The shield isolation layer 136 may extend laterally between the gate bottom surface 124 and the shield 114 for a distance sufficient to provide complete coverage of the angled surface 134 of the contact portion 132 of the shield 114, but does not extend a length of each of the trenches 110.

By way of example, the shield isolation layer 136 may extend laterally between the gate bottom surface 124 and the shield 114 for one to five μm. The shield isolation layer 136 may include silicon dioxide, with a hydrogen content less than 15 atomic percent. The shield isolation layer 136 may extend over the top surface 104 of the substrate 102, as shown in FIG. 1. The shield isolation layer 136 may be 100 to 300 nm thick, for example. The shield isolation layer 136 may advantageously reduce leakage current between the gate 122 and the contact portion 132 of the shield 114 during operation of the MOS transistor 112, compared to relying on an extension of the gate dielectric layer 128 to isolate the gate 122 from the contact portion 132 of the shield 114.

The shield isolation layer 136 may extend onto a top dielectric layer 138. The top dielectric layer 138 may include silicon dioxide, and may be 300 nm to one μm thick, for example. An edge of the top dielectric layer 138 adjacent to the contact portion 132 of the shield 114 may be tapered, as depicted in FIG. 1. Contacts 140 may extend through the top dielectric layer 138 to provide electrical connections to the contact portion 132 of the shield 114.

The MOS transistor 112 of this example includes a source 142 in the semiconductor material 108, contacting the gate dielectric layer 128. The source 142 has a first conductivity type, for example, n-type. The MOS transistor 112 of this example includes a body 144 in the semiconductor material 108, contacting the gate dielectric layer 128 and the source 142. The body 144 has a second conductivity type, opposite from the first conductivity type; in this example, the body 144 may be p-type, as indicated in FIG. 1. The MOS transistor 112 of this example includes a drain contact region 146 in the semiconductor material 108 below the trenches 110, which may be formed as a heavily-doped substrate that is partially removed by backgrinding after forming the other components of the MOS transistor 112. The drain contact region 146 has the first conductivity type, which is n-type in this example, as indicated in FIG. 1, and thus may be a heavily-doped n+ layer. A metal layer (not shown) may be formed on the drain contact region 146 for electrical contact. The semiconductor material 108 between the body 144 and the drain contact region 146 may have the first conductivity type, n-type in this example, and may provide a drain drift region for the MOS transistor 112.

Figure 2A:
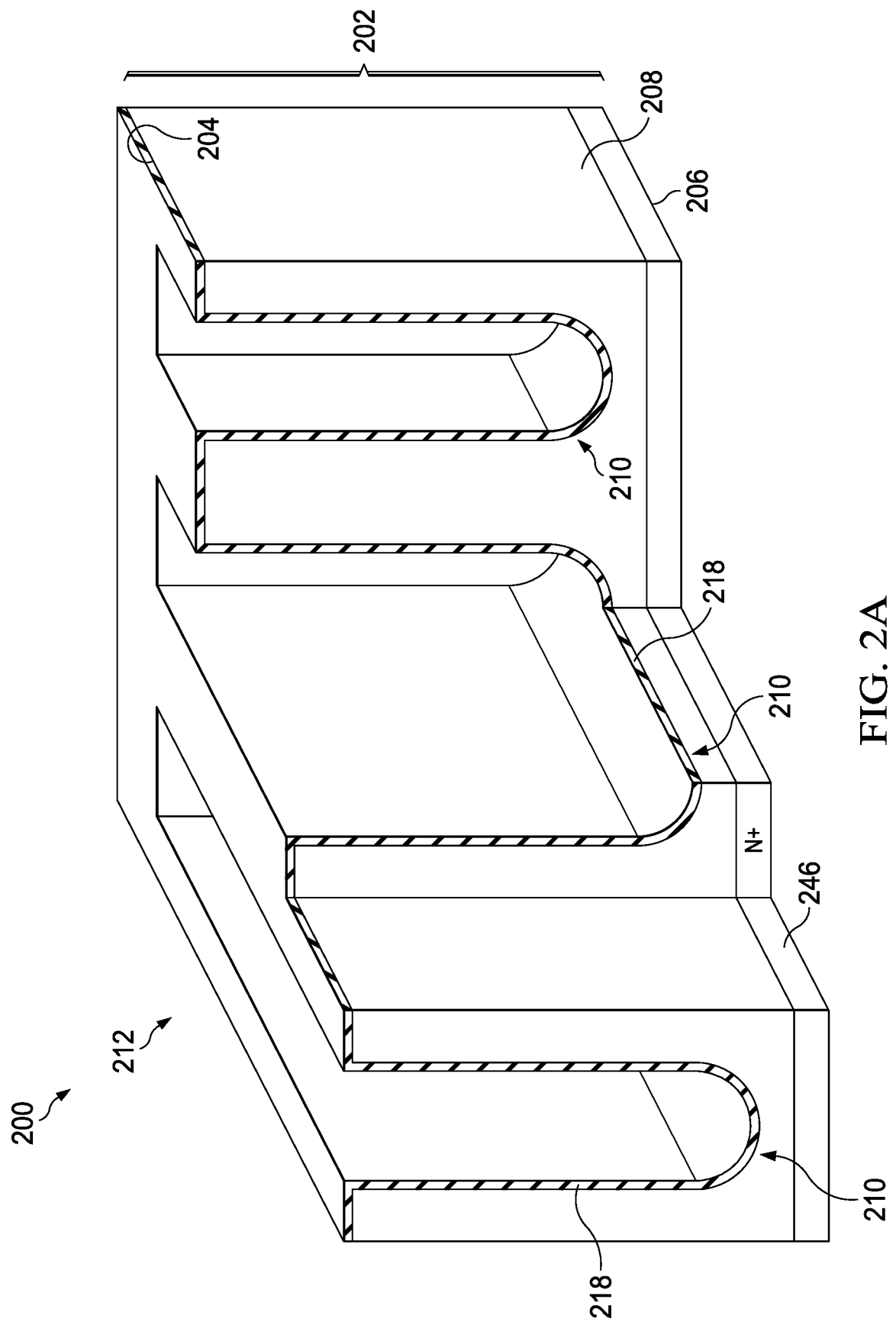
FIGS. 2A to 2N illustrate cross-sectional views of an example method of forming a semiconductor device.
Figure 2B:
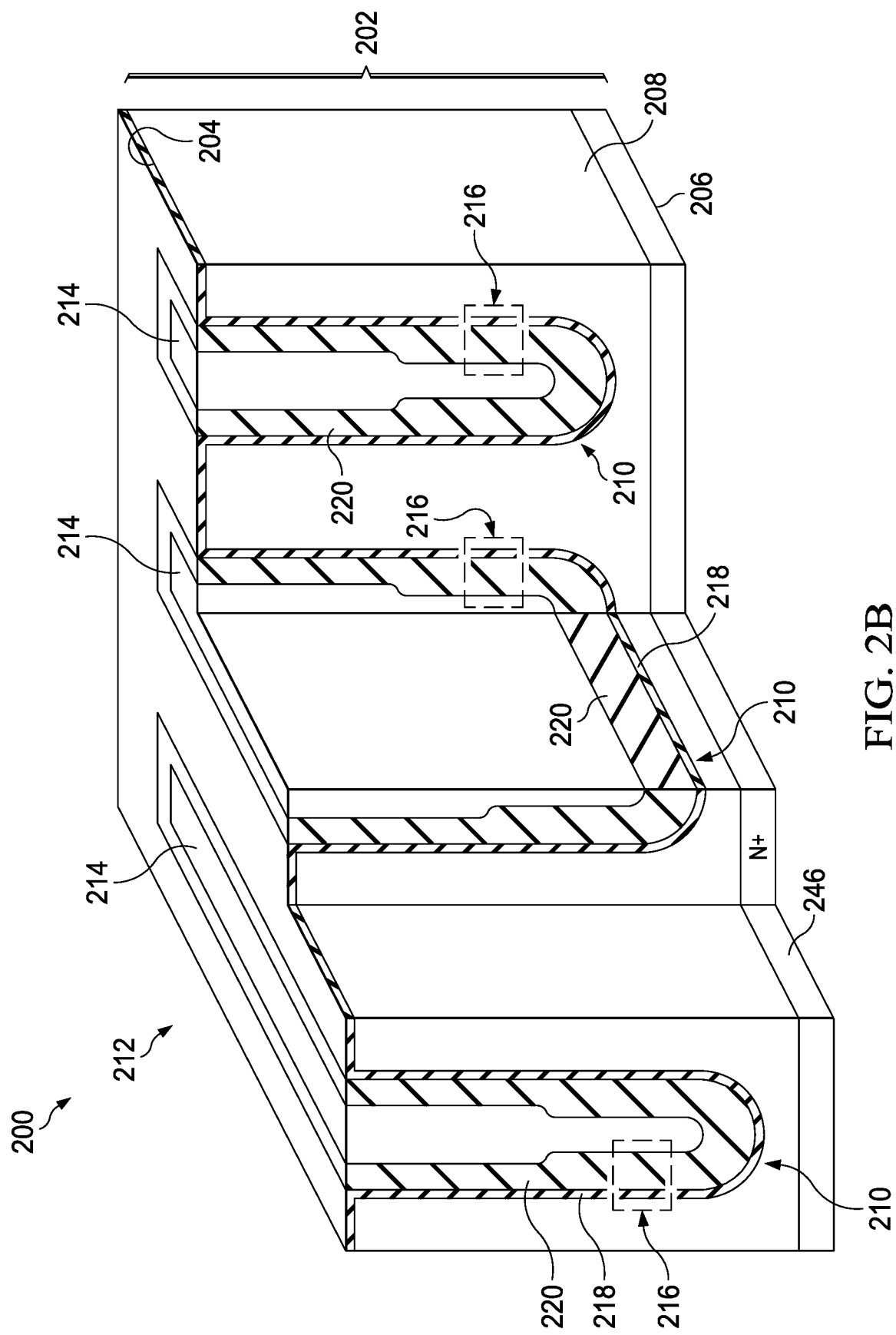
Figure 2C:
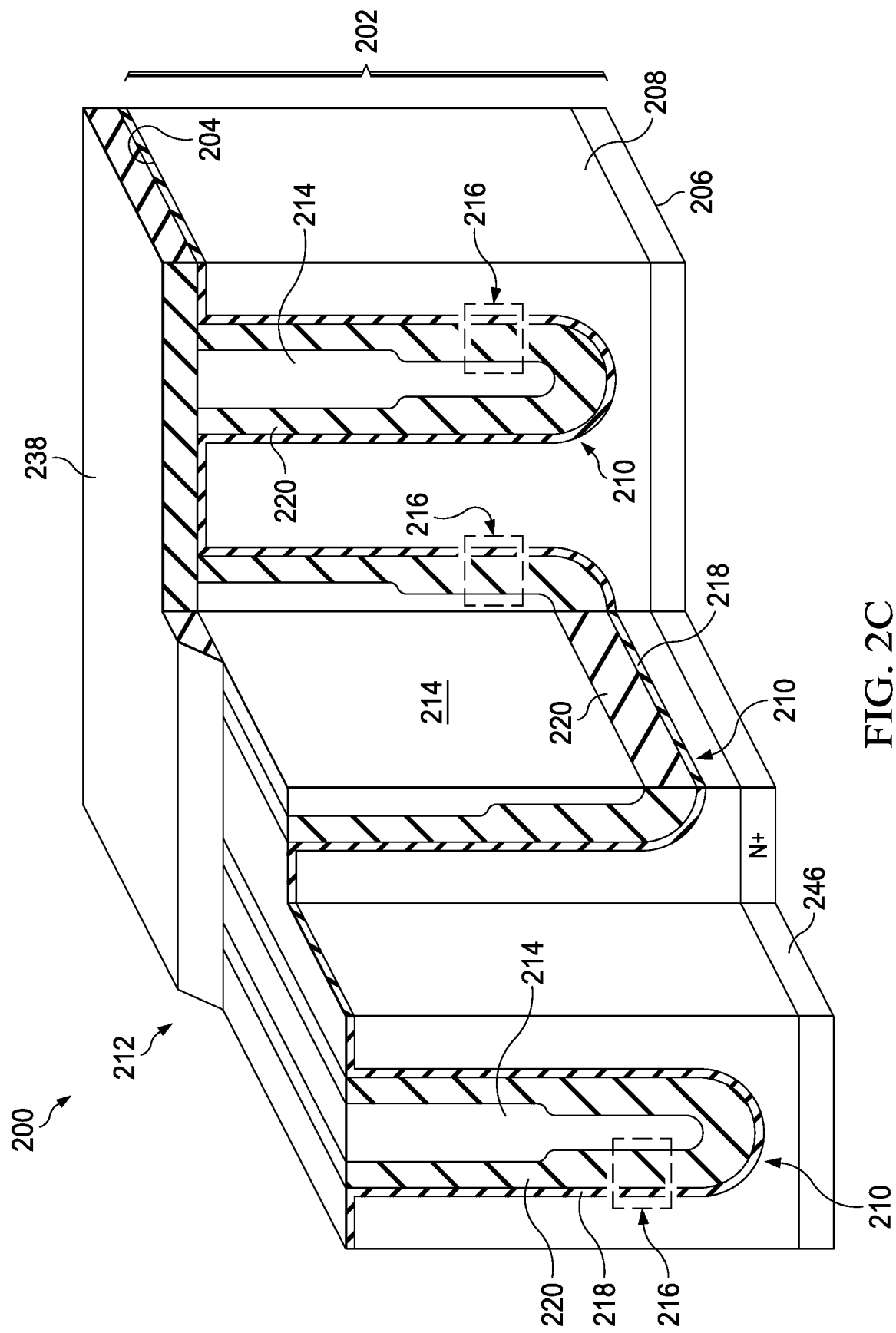
Figure 2D:
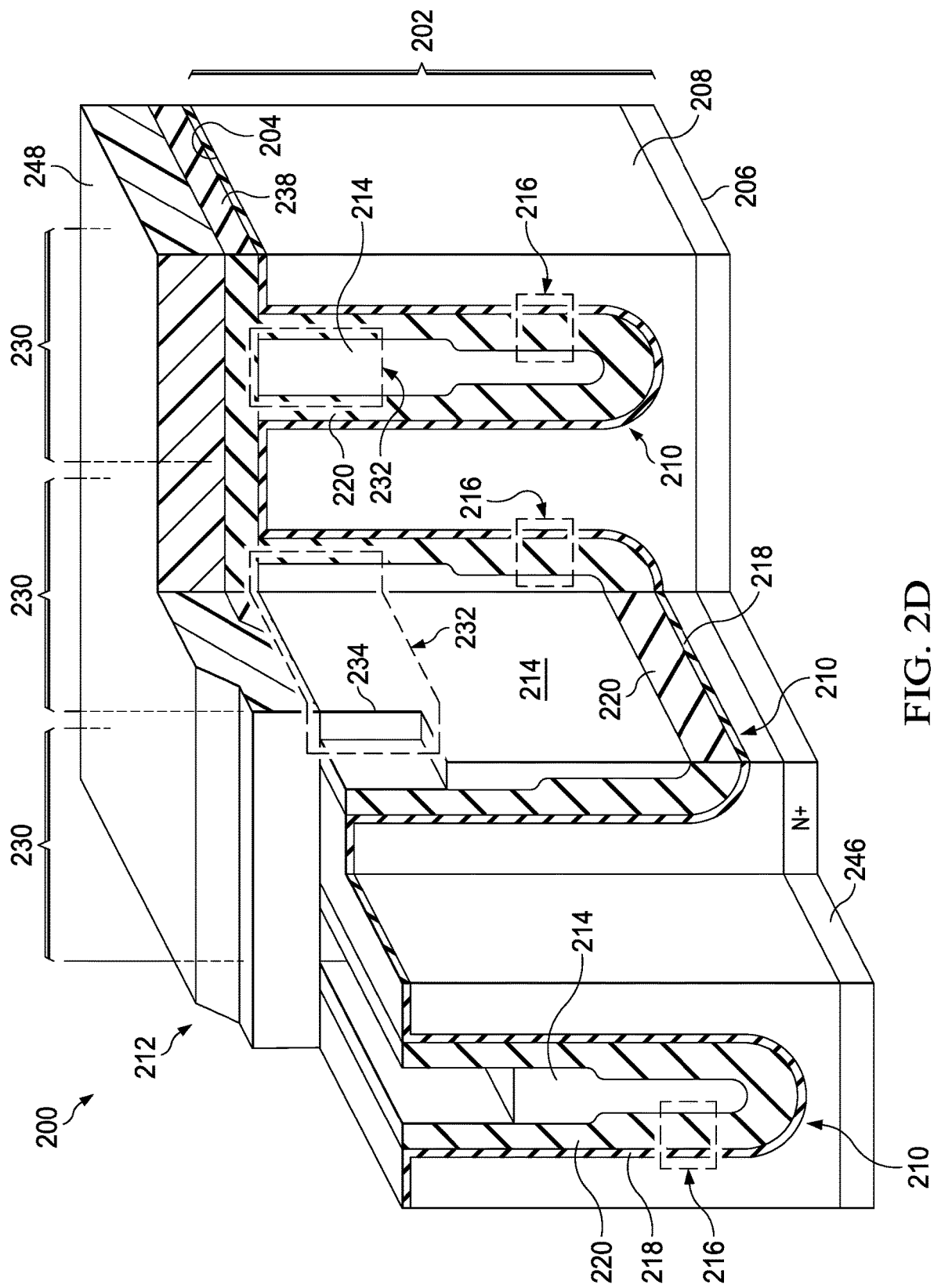
Figure 2E:
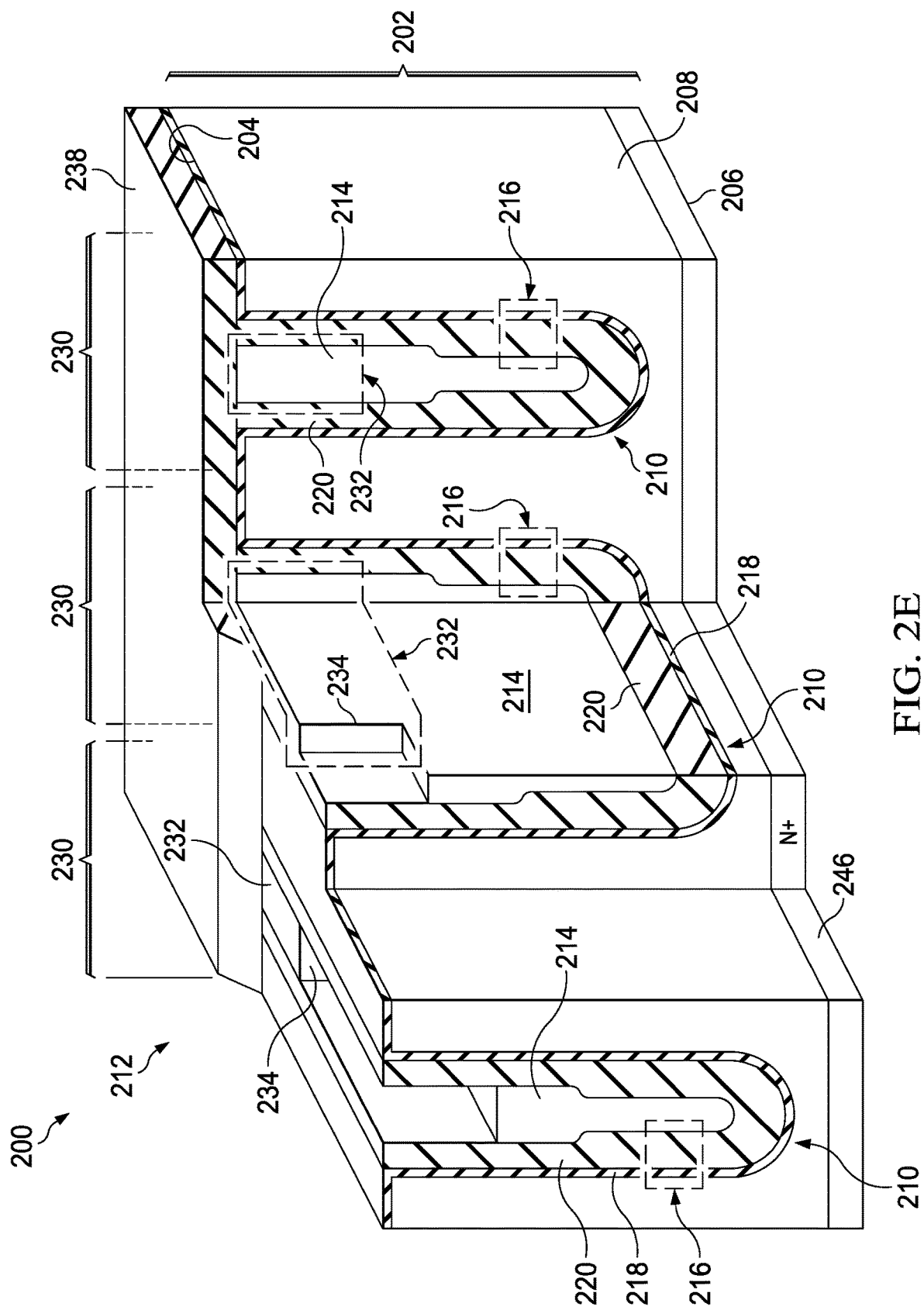
Figure 2F:
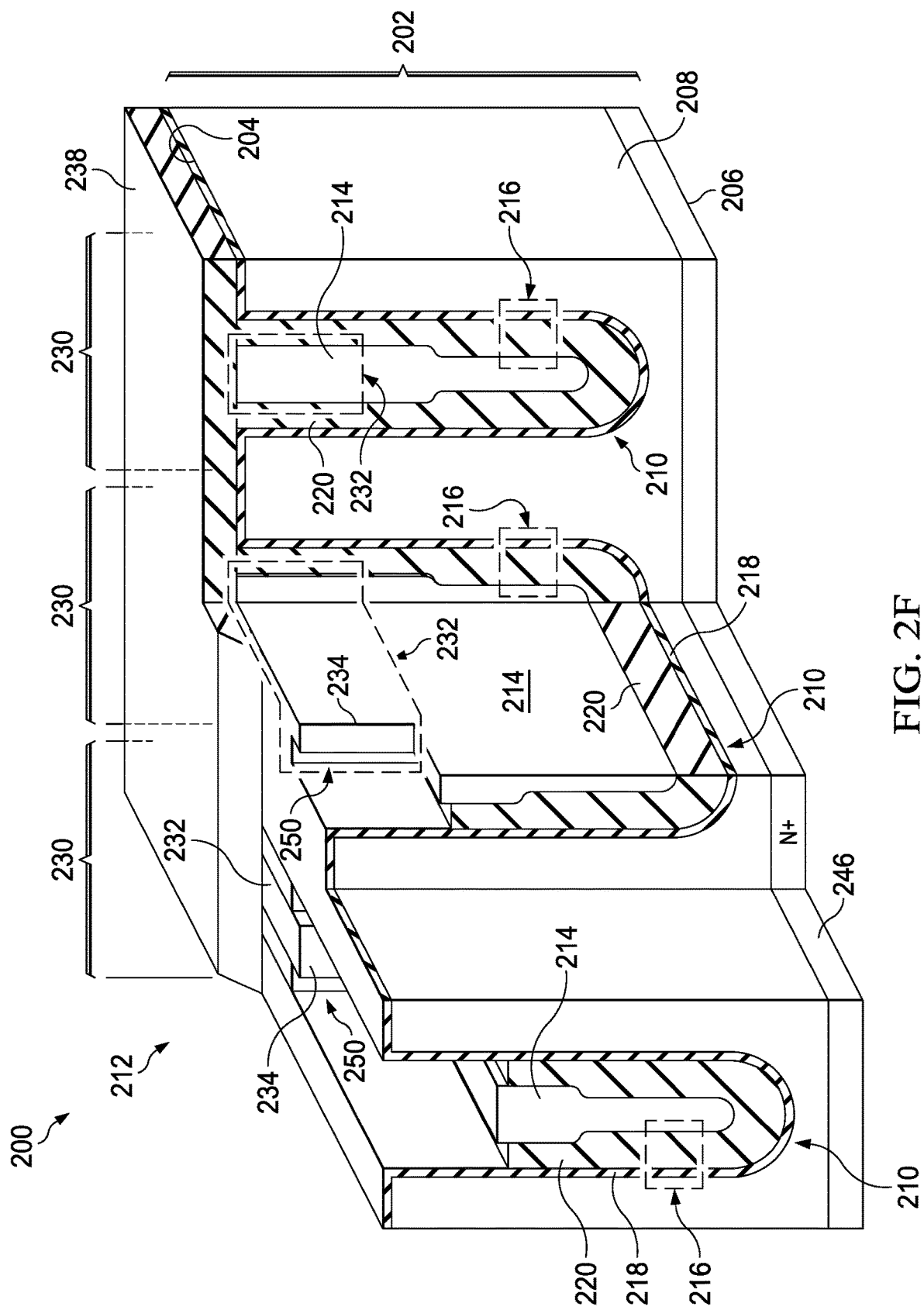
Figure 2G:
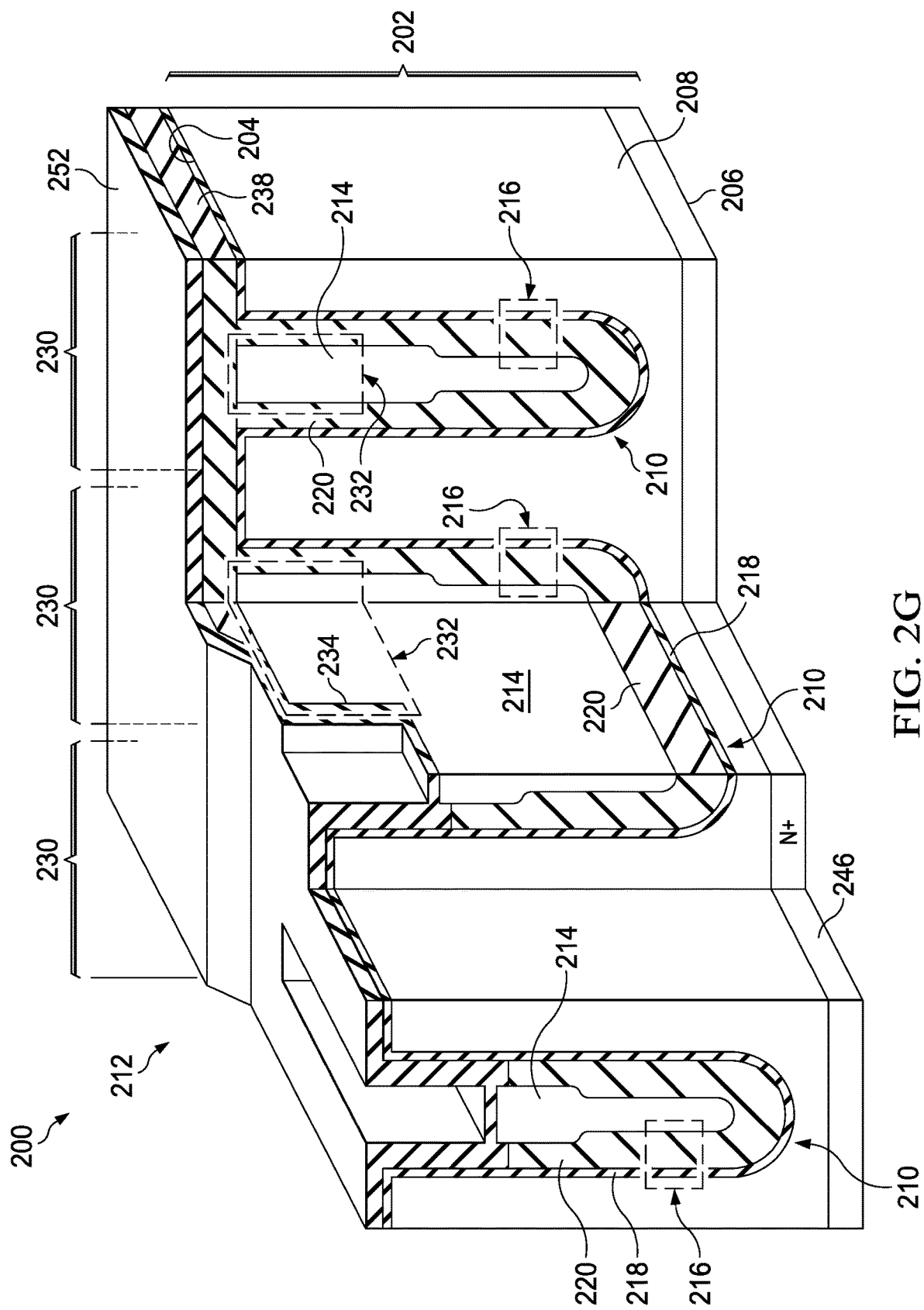
Figure 2H:
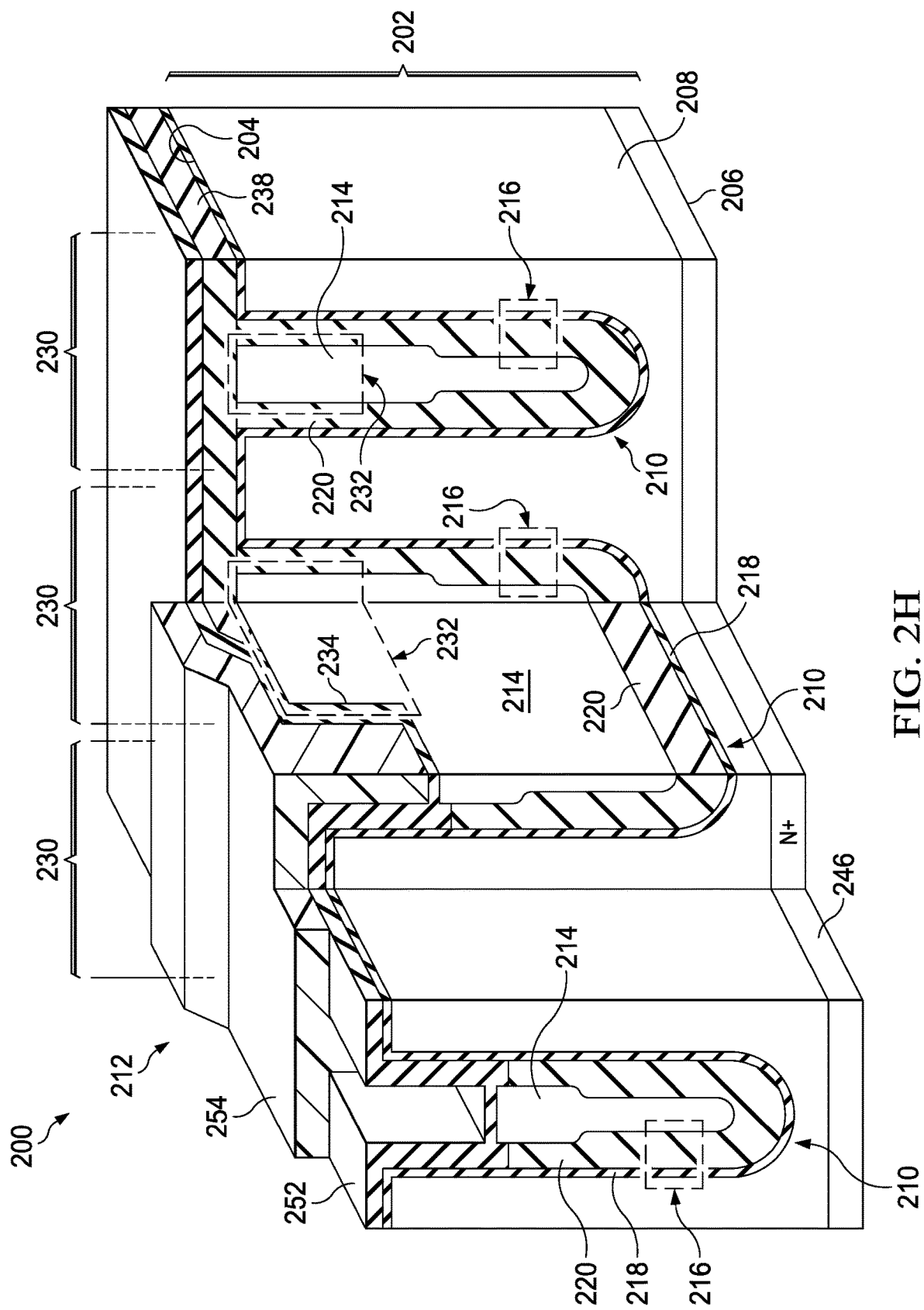
Figure 2I:
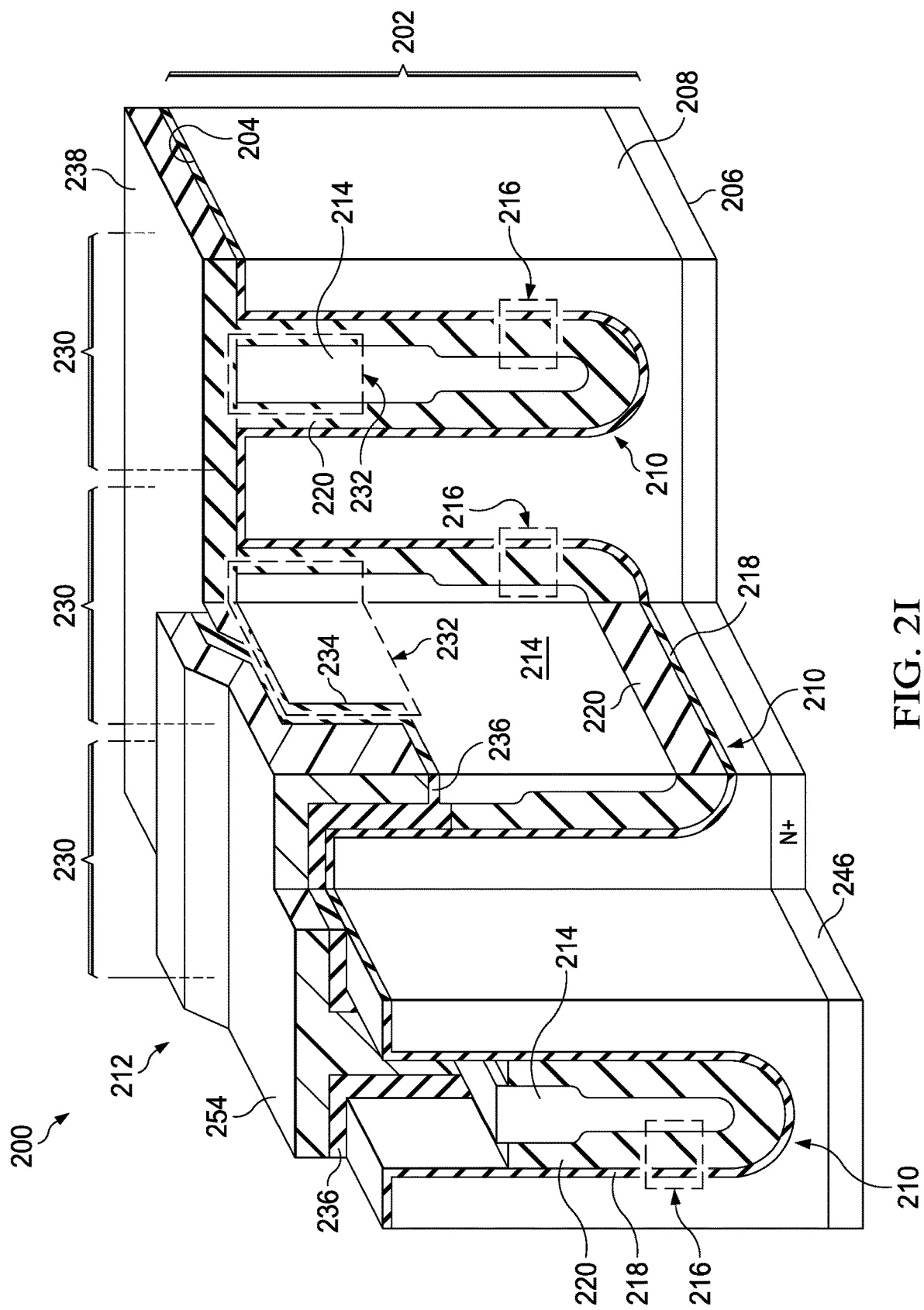
Figure 2J:
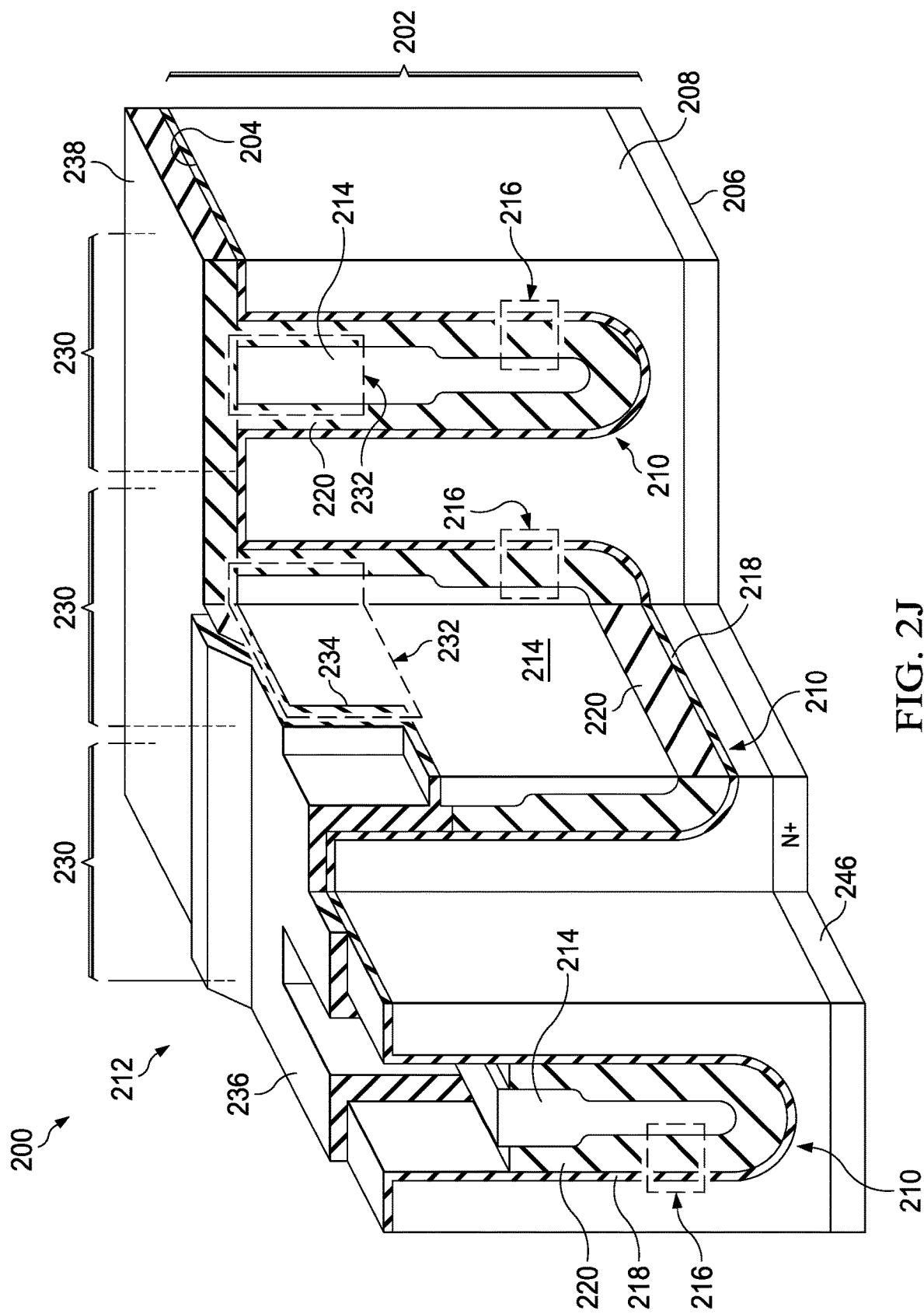
Figure 2K:
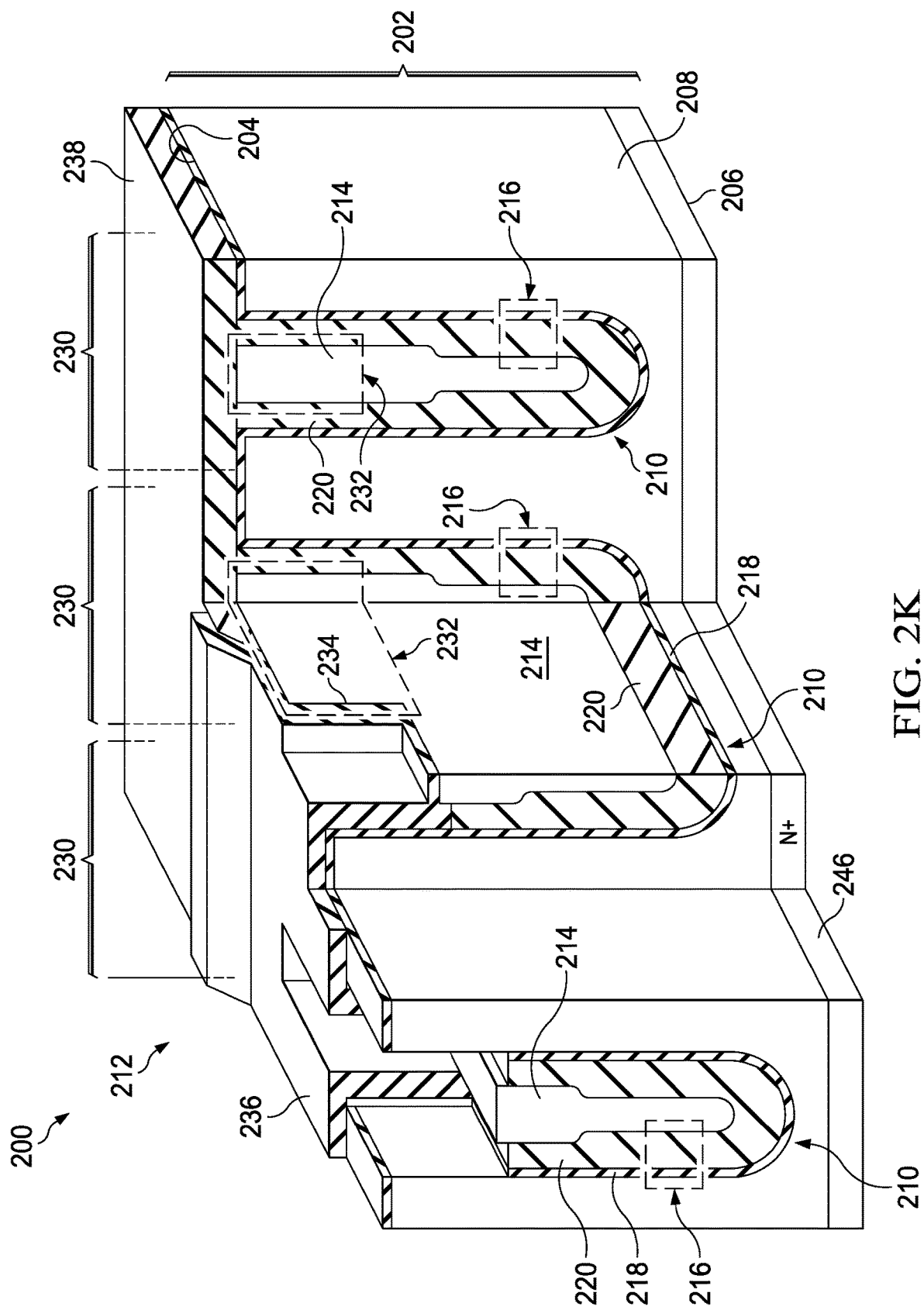
Figure 2L:
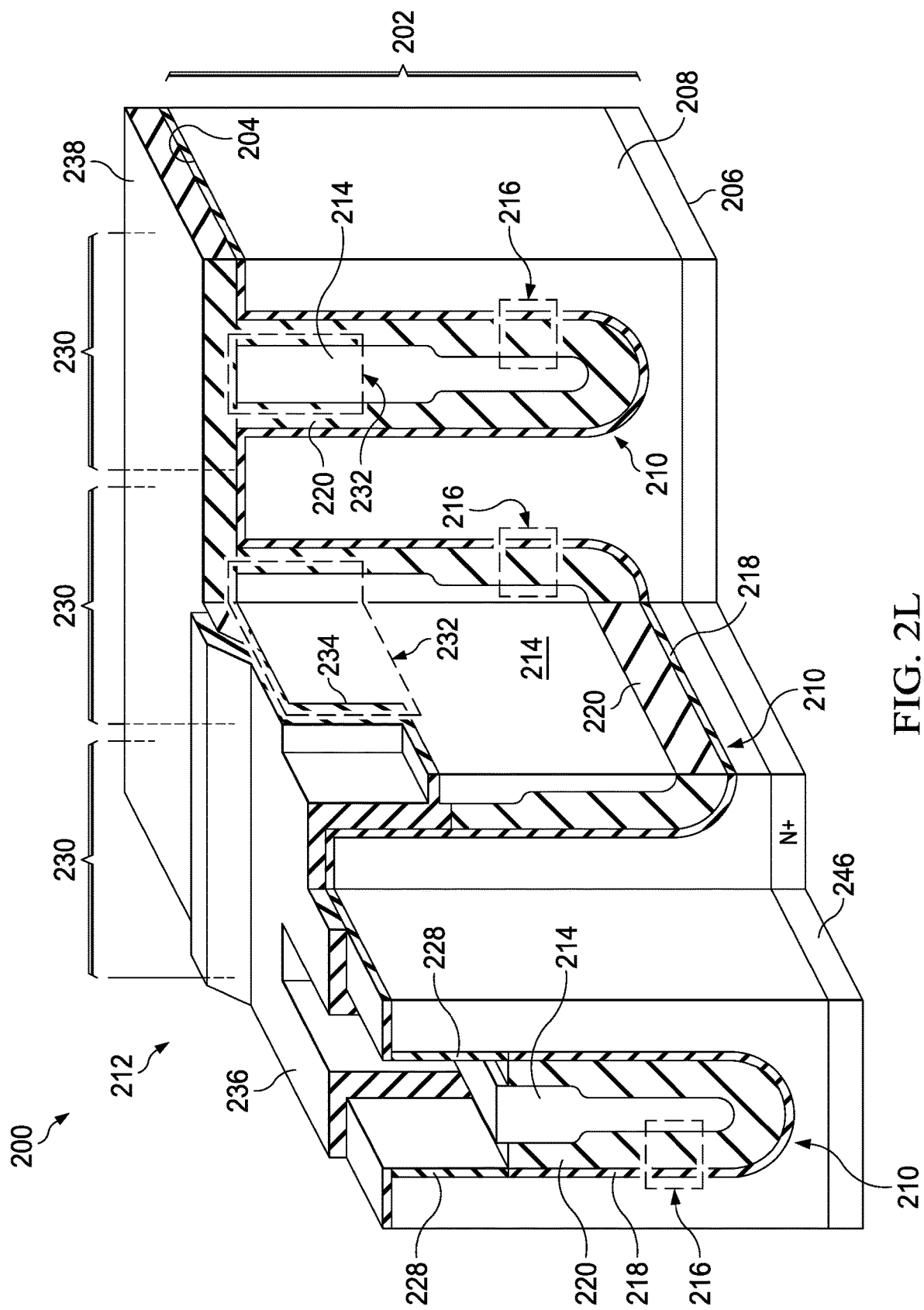
Figure 2M:
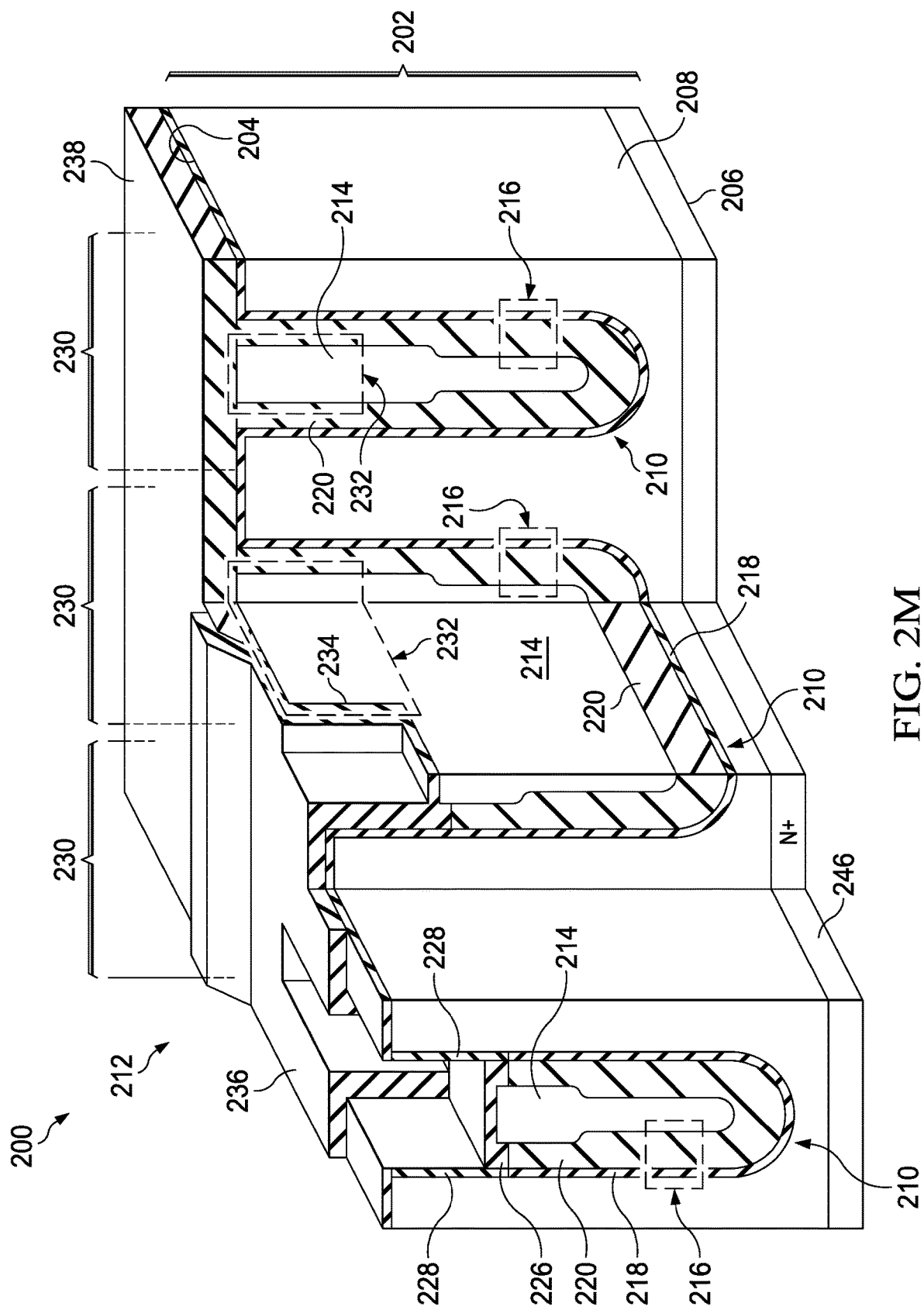
Figure 2N:
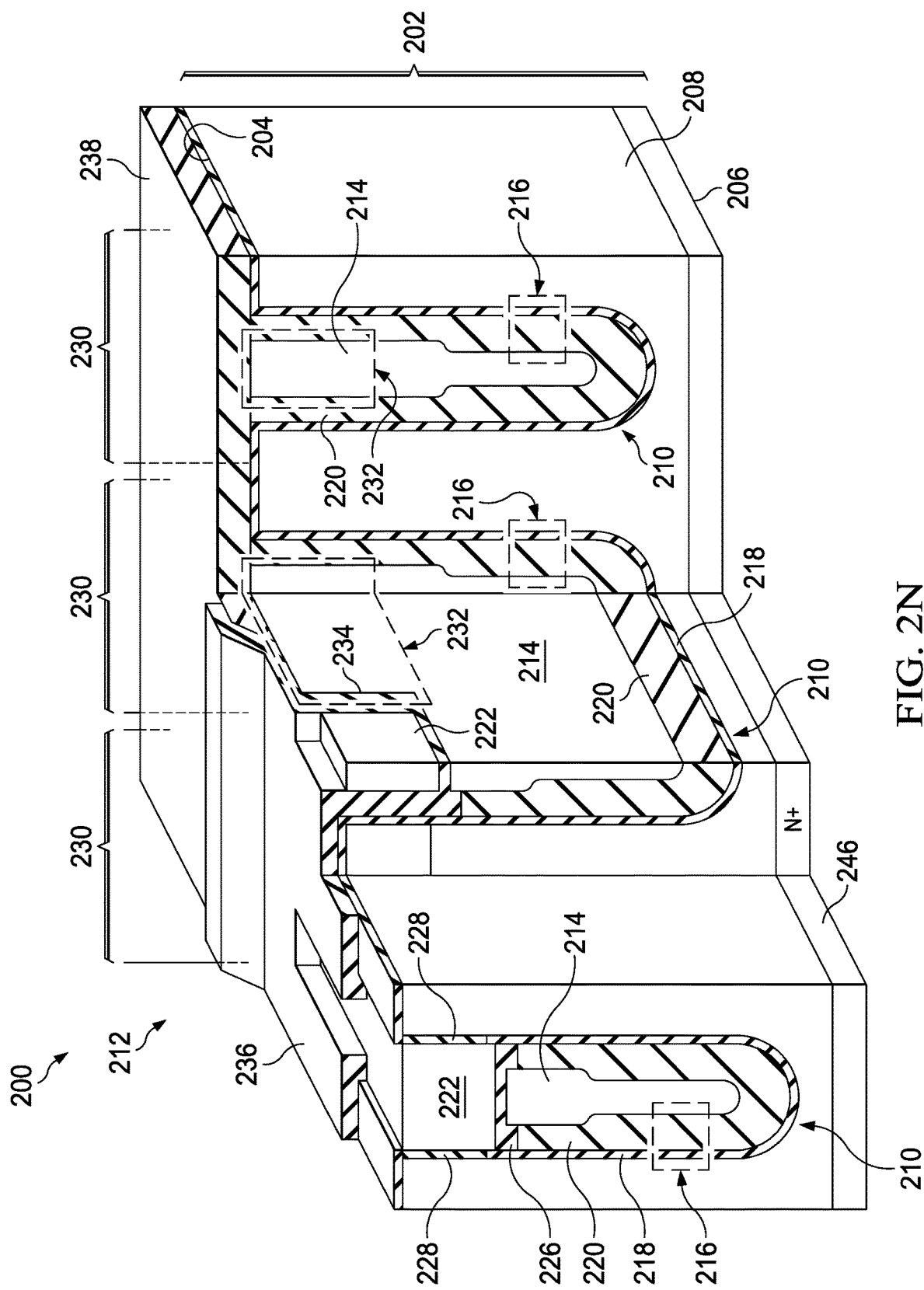

Turning now to FIGS. 2A to 2N, illustrated are cross-sectional views of an example method of forming a semiconductor device 200. Beginning with FIG. 2A, formation of the semiconductor device 200 includes providing a substrate 202. The substrate 202 may be implemented as a semiconductor wafer, such as a silicon wafer, optionally with an epitaxial layer, for example. The substrate 202 has a top surface 204, a bottom surface 206 located opposite from the top surface 204, and an N+ layer 246 extending from the bottom surface toward the top surface. The substrate 202 includes a semiconductor material 208, such as silicon. The semiconductor material 208 may extend from the top surface 204 to the bottom surface 206, as depicted in FIG. 2A.

The substrate 202 includes an area for an MOS transistor 212. In the area for the MOS transistor 212, one or more trenches 210 are formed in the substrate 202. The trenches 210 extend from the top surface 204 into the semiconductor material 208. The one or more trenches 210 may optionally be connected at a point not shown in FIG. 2A, to provide a single trench 210. The trenches 210 may extend to proximate to the N+ layer 246, as depicted in FIG. 2A. Alternatively, the trenches 210 may extend through the semiconductor material 208 to the N+ layer 246. The trenches 210 may be 0.5 to 2 μm wide, for example, and may have aspect ratios of 3:1 to 10:1, for example.

A first liner (e.g., a first dielectric liner) 218 is formed on the semiconductor material 208 in the trenches 210. The first liner 218 of this example is formed by a thermal oxidation process at a temperature above 800° C., so that the first liner 218 includes primarily thermal silicon dioxide having a stoichiometric composition of silicon dioxide, and a hydrogen content less than five atomic percent. The first liner 218 may have a thickness of 20 to 200 nm in the trenches 210, for example. The first liner 218 may extend over the top surface 204 of the substrate 202, as depicted in FIG. 2A.

Referring to FIG. 2B, a second liner (e.g., a second dielectric liner) 220 is formed on the trenches 210 on the first liner 218. The second liner 220 may be formed by a thermal chemical vapor deposition (CVD) process using tetraethyl orthosilicate (TEOS), $Si(OC_2H_5)_4$, sometimes referred to as tetraethoxysilane. The thermal CVD process may be implemented as a sub-atmospheric chemical vapor deposition (SACVD) process, for example, or as an atmospheric pressure chemical vapor deposition (APCVD) process. Alternatively, the second liner 220 may be formed by a plasma enhanced chemical vapor deposition (PECVD) process, using TEOS.

The second liner 220 includes primarily silicon dioxide. The second liner 220 is formed at a temperature sufficiently low so that the second liner 220 has an etch rate, in aqueous buffered hydrofluoric acid, that is at least twice an etch rate, in the same aqueous buffered hydrofluoric acid, of the first liner 218. By way of example, the second liner 220 may be formed below 600° C. The second liner 220 may be formed to have a greater thickness proximate to bottoms of the trenches 210 that proximate to tops of the trenches 210, as depicted in FIG. 2B. The second liner 220 may be formed in two or more steps to attain a desired thickness profile in the trenches 210. The second liner 220 may be removed from over the top surface 204 of the substrate 202, as indicated in FIG. 2B, or may extend over the top surface 204, similarly to the first liner 218. A combination of the first liner 218 and the second liner 220 provides a shield liner 216 in the trenches 210.

A shield 214 is formed in the trenches 210 on the shield liner 216, extending to proximate to the top surface 204 of the substrate 202. The shield 214 is electrically conductive, and is electrically isolated from the semiconductor material 208 by the shield liner 216. The shield 214 may be formed by thermal or plasma decomposition of silane or disilane, so that the shield 214 may include primarily polycrystalline silicon, again sometimes referred to as polysilicon. The shield 214 may be formed at a temperature that is sufficiently low so as to maintain the etch rate of the second liner 220, in aqueous buffered hydrofluoric acid, above twice the etch rate of the first liner 218. By way of one example, the shield 214 may be formed of undoped polycrystalline silicon at 600° C. to 620° C., and subsequently implanted with dopants and annealed to provide a desired electrical resistivity in the shield 214. By way of another example, the shield 214 may be formed of doped polycrystalline silicon at 500° C. to 580° C. by including dopant reagents with the silane or disilane.

Referring to FIG. 2C, a top dielectric layer 238 is formed over the top surface 204 of the substrate 202. The top dielectric layer 238 is patterned to expose the shield 214 in the trenches 210. The top dielectric layer 238 may include silicon dioxide, and may be 300 nm to one μm thick, for example. The top dielectric layer 238 may be formed by a thermal CVD process using TEOS, or by a PECVD process using TEOS, at a temperature that is sufficiently low so as to maintain the etch rate of the second liner 220, in aqueous buffered hydrofluoric acid, above twice the etch rate of the first liner 218. An edge of the top dielectric layer 238 adjacent to the shield 214 may be tapered, as depicted in FIG. 2C, using an erodable etch mask, and etching the top dielectric layer 238 using an isotropic plasma etch process.

Referring to FIG. 2D, a shield etch mask 248 is formed over the top surface 204 of the substrate 202, covering one or more contact portions 232 of the shield 214, which may be located, for example, at ends 230 of the trenches 210, and exposing the shield 214 past the contact portion 232. The shield etch mask 248 may include photoresist, and may be formed by a photolithographic process. The shield etch mask 248 may include hard mask materials, such as silicon nitride or amorphous carbon. In an alternate version of this example, the shield etch mask 248 may be used to provide an etch mask for both the top dielectric layer 238 and the shield 214, advantageously reducing fabrication cost and complexity of the semiconductor device 200.

A portion of the shield 214 is removed where exposed by the shield etch mask 248, leaving the shield 214 along a bottom portion of the trenches 210. The portion of the shield 214 may be removed by a reactive ion etch (RIE) process using chlorine or bromine. The portion of the shield 214 may be removed by a timed etch process, to remove a desired amount of the shield 214. The process of removing the portion of the shield 214 leaves the contact portion 232 with an angled surface 234 extending proximate to the top surface 204 of the substrate 202. The process of removing the portion of the shield 214 also leaves at least a portion of the shield liner 216 in the trenches 210, extending to the top surface 204, as depicted in FIG. 2D.

Referring to FIG. 2E, the shield etch mask 248 of FIG. 2D is removed. The shield etch mask 248 may be removed by an oxygen plasma process, such as an asher process or a downstream asher process, or an ozone process, followed by a wet clean process using an aqueous mixture of sulfuric acid and hydrogen peroxide. Other methods for removing the shield etch mask 248 are within the scope of this example. The shield etch mask 248 may be used to provide an etch mask for the top dielectric layer 238, before being removed, as noted above.

Referring to FIG. 2F, the second liner 220 is removed from the trenches 210 where exposed by the shield 214. The second liner 220 may be removed by a wet etch using an aqueous solution of buffered hydrofluoric acid, for example a one percent solution of buffered hydrofluoric acid. At least a portion of the first liner 218 remains in the trenches 210, extending up to the top surface 204 of the substrate 202, due to the lower etch rate of the first liner 218 in the buffered hydrofluoric acid solution than the second liner 220. The wet etch to remove the second liner 220 may be a timed etch process, to remove the second liner 220 where exposed by the shield 214, while reducing etching of the second liner 220 between the shield 214 and the first liner 218.

Forming the second liner 220 to have an etch rate at least twice that of the first liner 218 may advantageously enable complete removal of the second liner 220 where exposed by the shield 214 while leaving a continuous portion of the first liner 218 on the semiconductor material 208 in the trenches 210, preventing erosion of the semiconductor material 208. The process of removing the second liner 220 where exposed by the shield 214 may result in grooves 250 in the second liner 220 along the angled surface 234 of the contact portion 232 of the shield 214, between the contact portion 232 and the first liner 218, as depicted in FIG. 2F. The grooves 250 may expose edges of the contact portion 232 of the shield 214 along the angled surface 234. These edges may be difficult to electrically isolate from a subsequently-formed gate 222, shown in FIG. 2N, by a subsequently formed gate dielectric layer 228, shown in FIG. 2L, alone.

Referring to FIG. 2G, a conformal layer 252 is formed over the top dielectric layer 238 and the top surface 204 of the substrate 202, extending into the trenches 210 and covering the shield 214, including the angled surface 234 of the contact portion 232 of the shield 214. The conformal layer 252 fills in the grooves 250 of FIG. 2F in the second liner 220 along the angled surface 234 of the contact portion 232 of the shield 214. The conformal layer 252 includes primarily silicon dioxide, and is formed, in this example, by a thermal CVD process using TEOS, such as an SACVD process or an APCVD process, or a PECVD process using TEOS, at a temperature sufficiently low so that the conformal layer 252 has an etch rate, in aqueous buffered hydrofluoric acid, that is at least twice an etch rate, in the same aqueous buffered hydrofluoric acid, of the first liner 218. By way of example, the conformal layer 252 may be formed at approximately 600° C. The conformal layer 252 is formed to be conformal in the trenches 210, that is, an average thickness of the conformal layer 252 on angled surfaces of the trenches 210 is 50 percent to 125 percent of an average thickness of the conformal layer 252 on horizontal surfaces in the trenches 210.

Referring to FIG. 2H, an isolation etch mask 254 is formed over the conformal layer 252. The isolation etch mask 254 extends over the contact portion 232 of the shield 214 and into the trenches 210 past the angled surface 234 of the contact portion 232. The isolation etch mask 254 does not cover the shield 214 throughout the trenches 210. The isolation etch mask 254 may extend over the shield 214 past the angled surface 234 a lateral distance of one to five μm, for example, to allow for undercut of the conformal layer 252 while maintaining complete coverage of the angled surface 234. The isolation etch mask 254 may include photoresist, and may be formed by a photolithographic process. Alternatively, the isolation etch mask 254 may include a polymer, and may be formed by an additive process, such as an ink jet process or a material extrusion process.

Referring to FIG. 2I, the conformal layer 252 of FIG. 2H is removed where exposed by the isolation etch mask 254 to form a shield isolation layer 236 of the conformal layer 252 covered by the isolation etch mask 254. The conformal layer 252 may be removed by a wet etch using an aqueous solution of buffered hydrofluoric acid, for example a one percent solution of buffered hydrofluoric acid. The conformal layer 252 may be removed by a wet etch similar to that used to remove a portion of the second liner 220 as disclosed in reference to FIG. 2F. The process of removing the conformal layer 252 is performed so as to leave at least a portion of the first liner 218 in the trenches 210, extending up to the top surface 204 of the substrate 202, due to the lower etch rate of the conformal layer 252 in the buffered hydrofluoric acid solution than the first liner 218. The wet etch to remove the conformal layer 252 may be a timed etch process, to reduce undercut of the conformal layer 252 and to reduce etching of the second liner 220 between the shield 214 and the first liner 218. Forming the conformal layer 252 to have an etch rate at least twice that of the first liner 218 may advantageously enable complete removal of the conformal layer 252 where exposed by the isolation etch mask 254 while leaving a continuous portion of the first liner 218 on the semiconductor material 208 in the trenches 210, preventing erosion of the semiconductor material 208.

Referring to FIG. 2J, the isolation etch mask 254 of FIG. 2I is removed. The isolation etch mask 254 may be removed by an oxygen plasma process followed by a wet clean process, such as the process described for removal of the shield etch mask 248, disclosed in reference to FIG. 2E.

The shield isolation layer 236 may optionally be heated after the isolation etch mask 254 is removed, to reduce an etch rate of the shield isolation layer 236 in an aqueous solution of buffered hydrofluoric acid, prior to removing the first liner 218 where exposed by the second liner 220 and the shield isolation layer 236. For example, the shield isolation layer 236 may be heated to 800° C. to 900° C., for five minutes to 60 minutes. Alternatively, formation of the semiconductor device 200 may be continued without heating the shield isolation layer 236.

The shield isolation layer 236 covers the angled surface 234 of the contact portion 232 of the shield 214, and extends into the grooves 250 in the second liner 220, as shown in FIG. 2F, along the angled surface 234 of the contact portion 232 of the shield 214. The shield isolation layer 236 may be formed to extend laterally on the shield 214 for a distance sufficient to provide complete coverage of the angled surface 234.

Referring to FIG. 2K, the first liner 218 is removed in the trenches 210 where exposed by the second liner 220 and by the shield isolation layer 236. The first liner 218 may be removed by an aqueous solution of buffered hydrofluoric acid, which may also remove a portion of the second liner 220 and a portion of the shield isolation layer 236. The top surface 204 of the substrate 202 may remain covered by silicon dioxide after the first liner 218 is removed in the trenches 210, as depicted in FIG. 2K. Alternatively, removal of the first liner 218 in the trenches 210 may result in removal of silicon dioxide from a portion or all of the top surface 204 where exposed by the shield isolation layer 236 and the top dielectric layer 238. Forming the first liner 218 to be thinner than the second liner 220 and thinner than the shield isolation layer 236 may advantageously enable removal of the first liner 218 without significant degradation of the second liner 220 and the shield isolation layer 236.

Referring to FIG. 2L, a gate dielectric layer 228 is formed on the semiconductor material 208 in the trenches 210 where exposed by the first liner 218. The gate dielectric layer 228 may be formed by a thermal oxidation process, and may have a thickness of 5 to 500 nm, for example. Other methods for forming the gate dielectric layer 228 are within the scope of this example. Forming the gate dielectric layer 228 may result in forming a dielectric layer, not shown in FIG. 2L, on the shield 214 in the trenches 210.

Referring to FIG. 2M, a lateral insulator 226 may be formed over the shield 214 in the trenches 210. The lateral insulator 226 electrically isolates the shield 214 from a subsequently-formed gate 222, shown in FIG. 2N. A method of forming the lateral insulator is hereinafter described with respect to FIGS. 3A through 3S.

Referring to FIG. 2N, the gate 222 is formed in the trenches 210, contacting the gate dielectric layer 228. The gate 222 may include polycrystalline silicon, and may be formed by thermal or plasma decomposition of silane or disilane, for example. The gate 222 may be formed by a process similar to that used to form the shield 214. The gate 222 is isolated from the contact portion 232 of the shield 214 by the shield isolation layer 236. The shield isolation layer 236 may limit a low leakage current between the gate 222 and the shield 214 to a desired value during operation of the MOS transistor 212. Formation of the semiconductor device 200 is continued by forming a source, body, drain contact region, and contacts, not shown in FIG. 2N, to provide a structure similar to the semiconductor device 100 of FIG. 1.

As mentioned above, a low level of gate leakage current is generally a design characteristic for the MOS transistor. The lateral insulator as described provides a level of isolation between the shield and the gate to achieve the low level of gate leakage current. The lateral insulator as described below more specifically describes an example of the lateral insulator 126, 226 for the semiconductor device 100, 200, respectively, to achieve the aforementioned intended results.

Figure 3B:
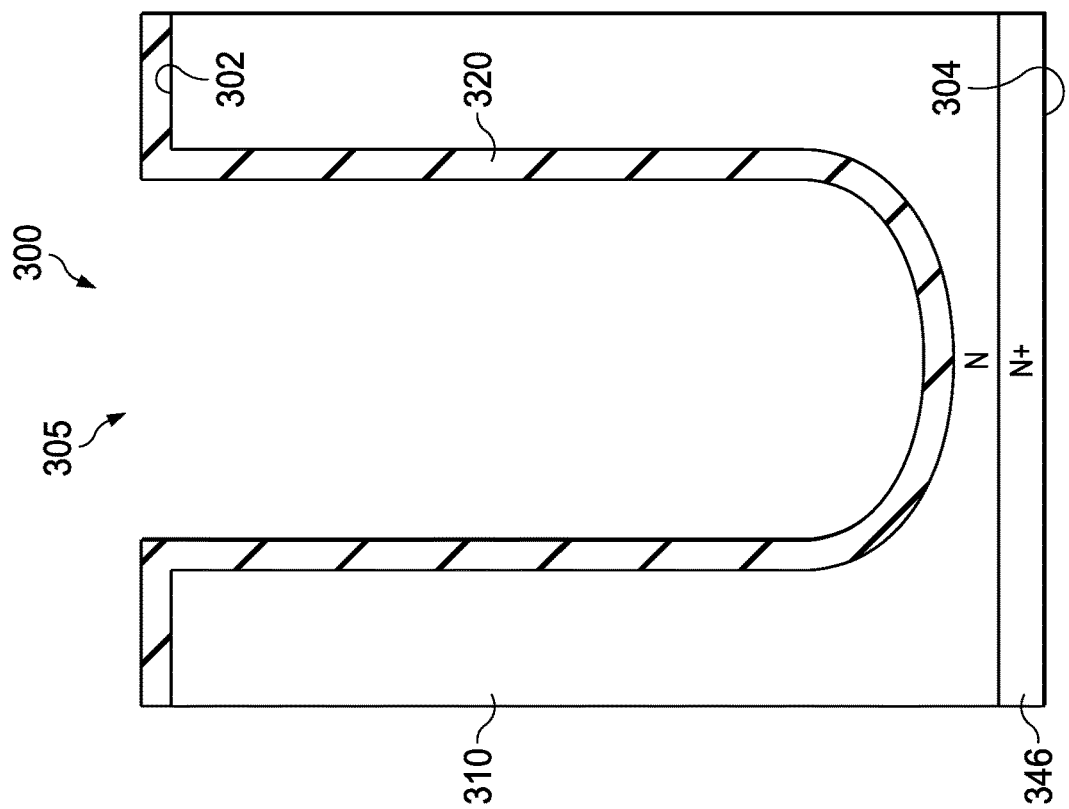
FIGS. 3A to 3S illustrate cross-sectional views of an example method of forming a semiconductor device.
Figure 3A:
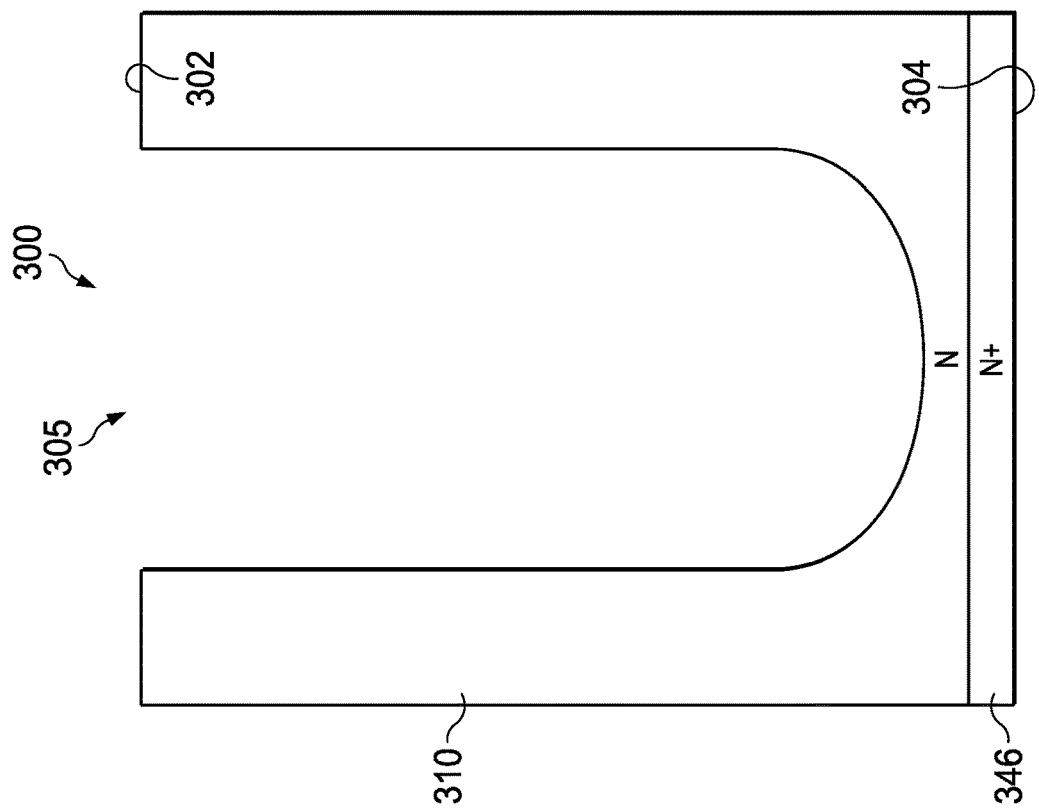
Figure 3D:
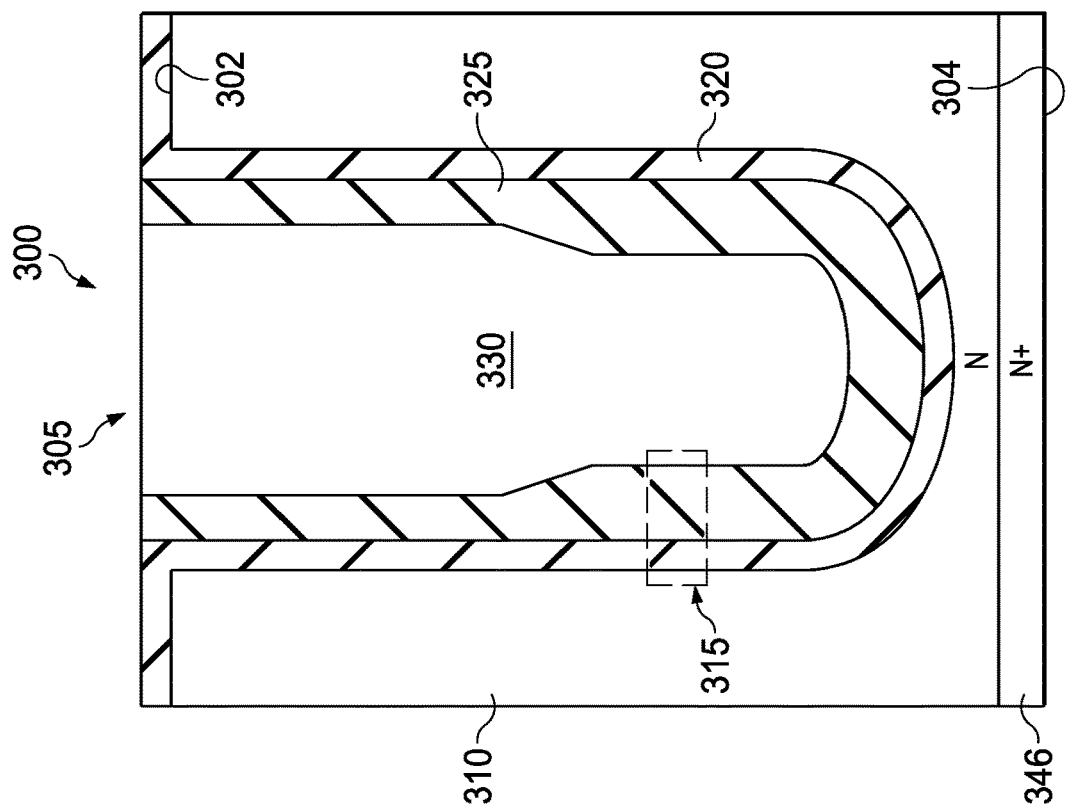
Figure 3C:
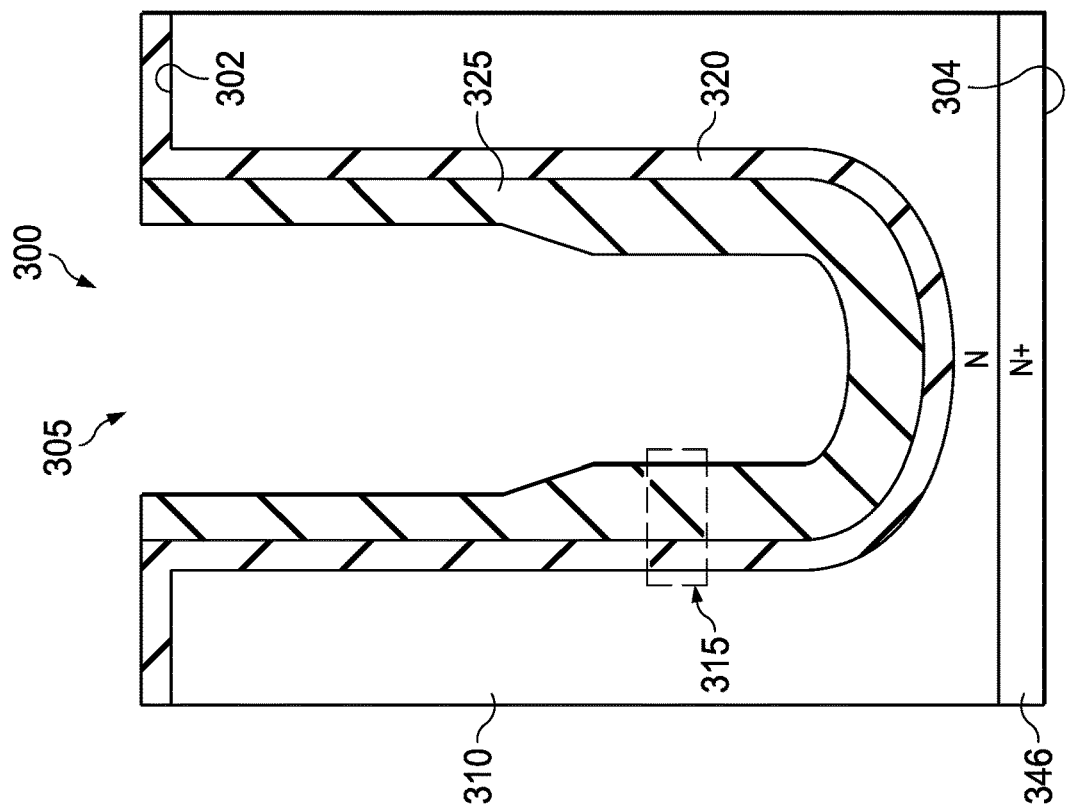
Figures 1, 3F:
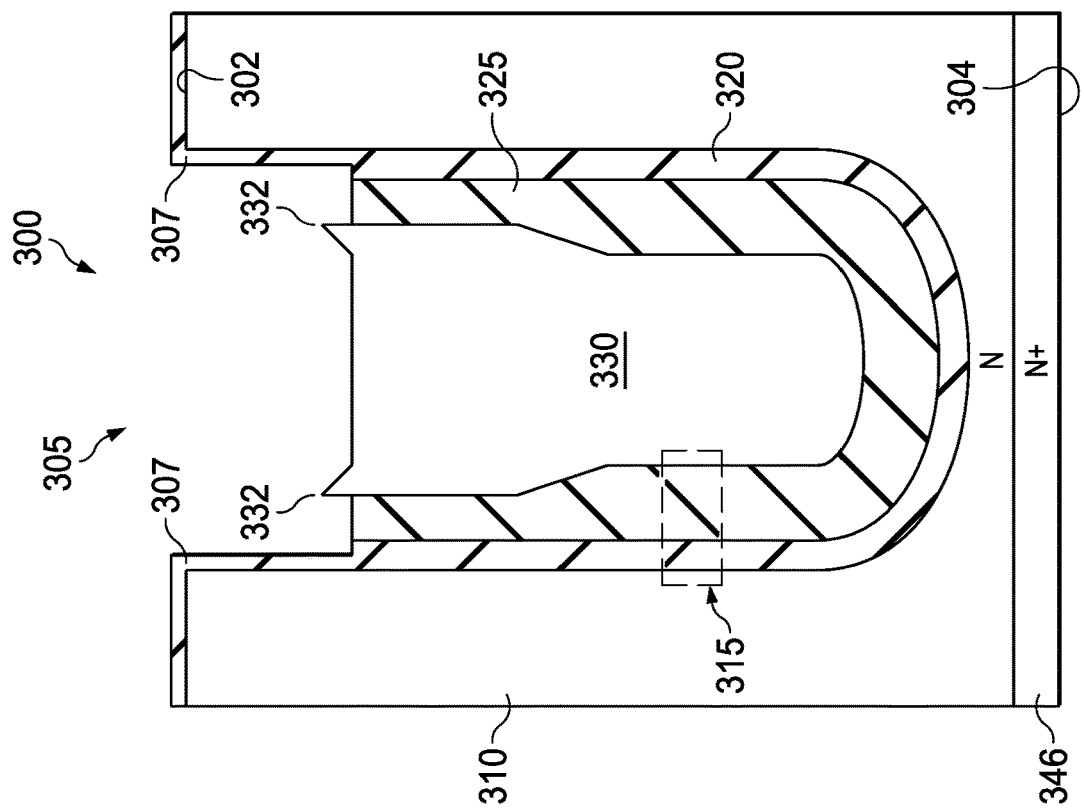
Figure 3E:
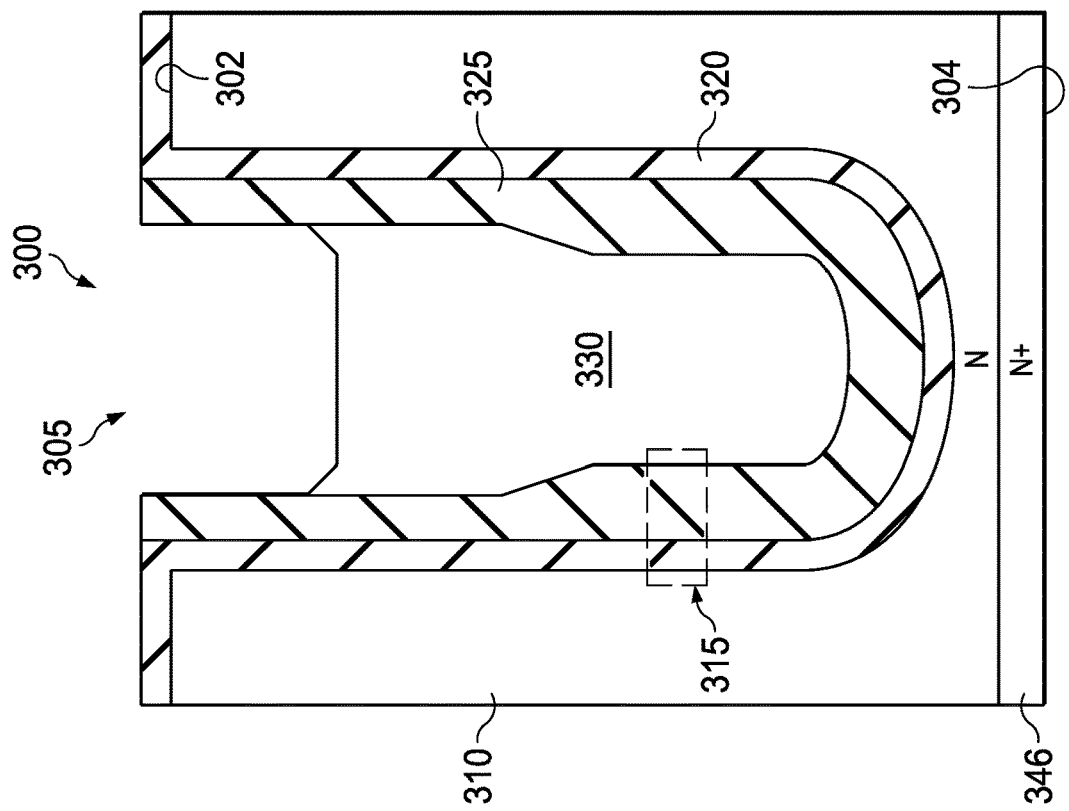
Figures 2, 3F:
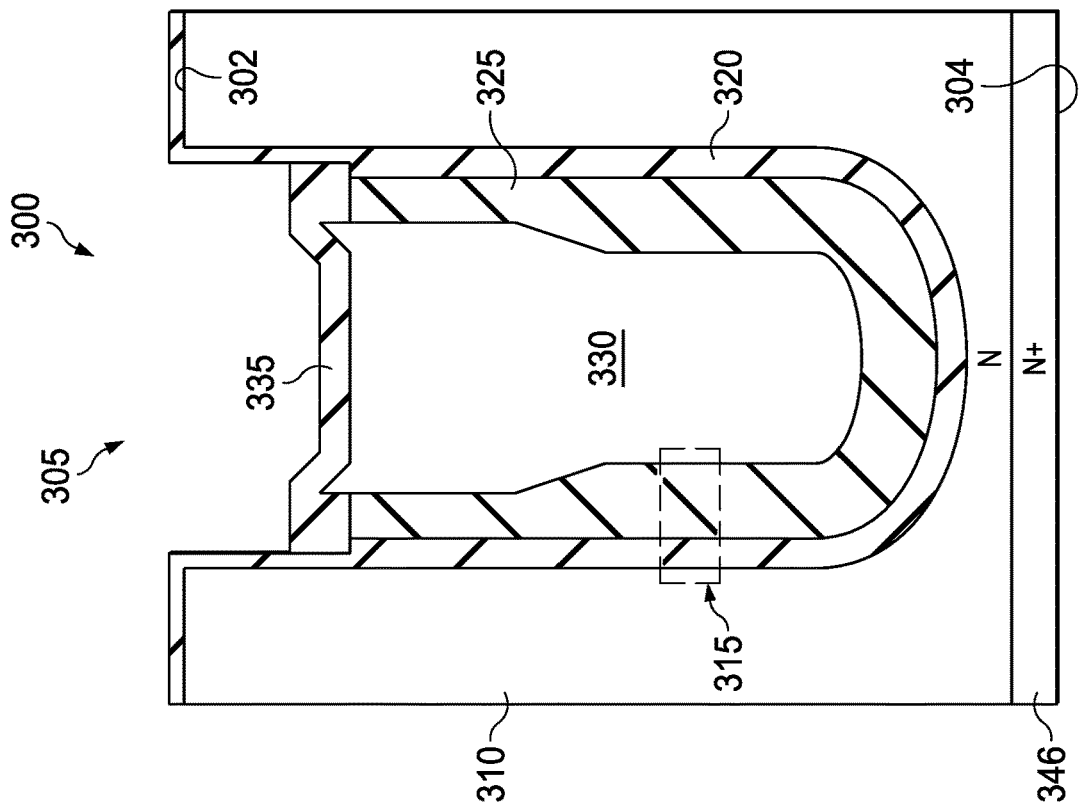
Figure 3G:
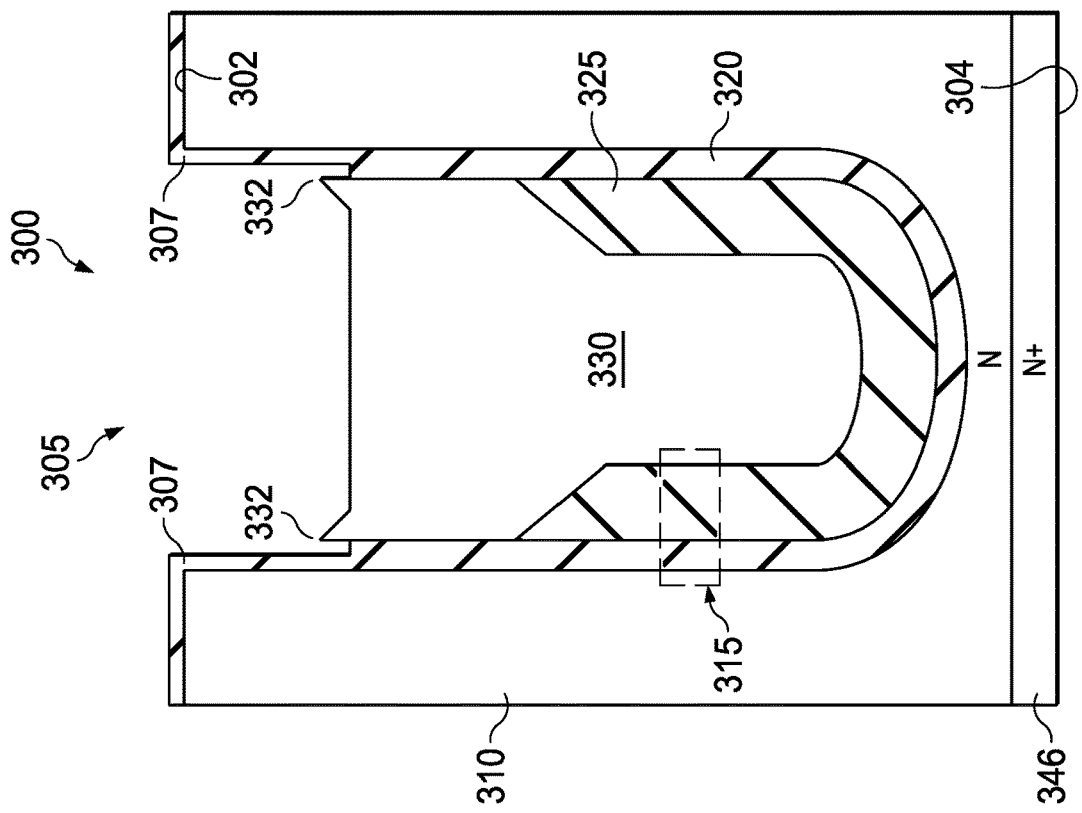
Figure 3M:
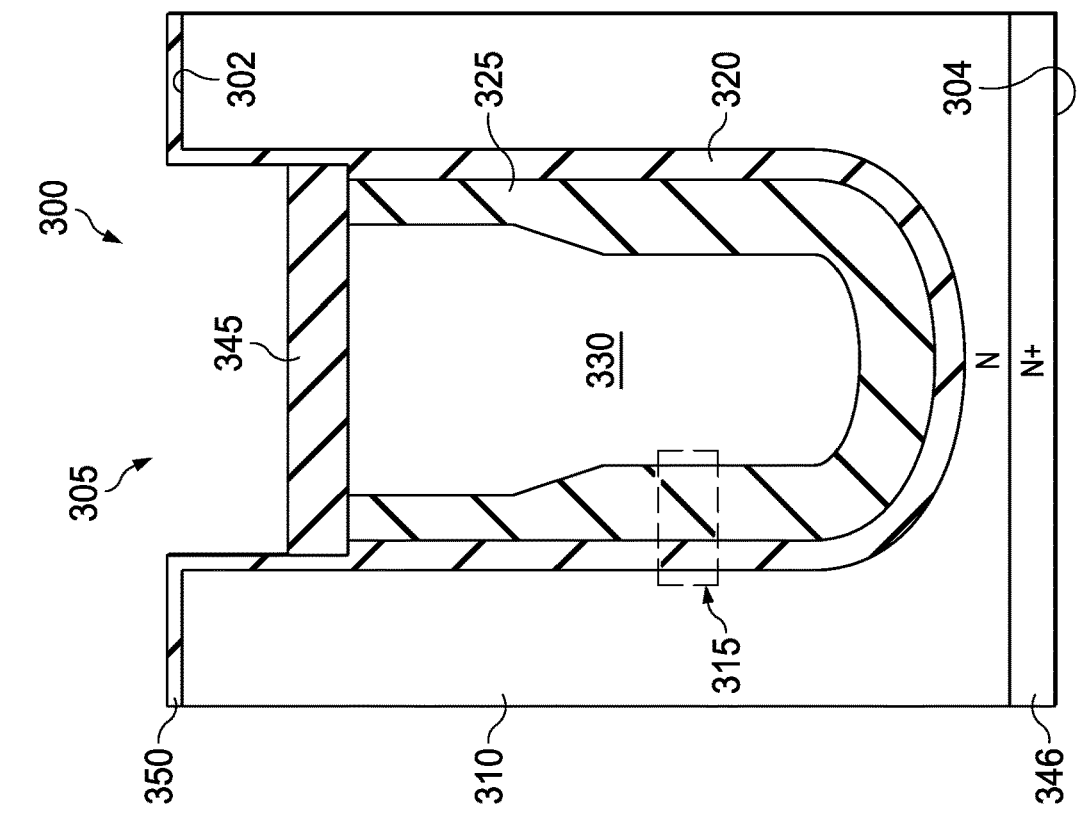
Figure 3L:
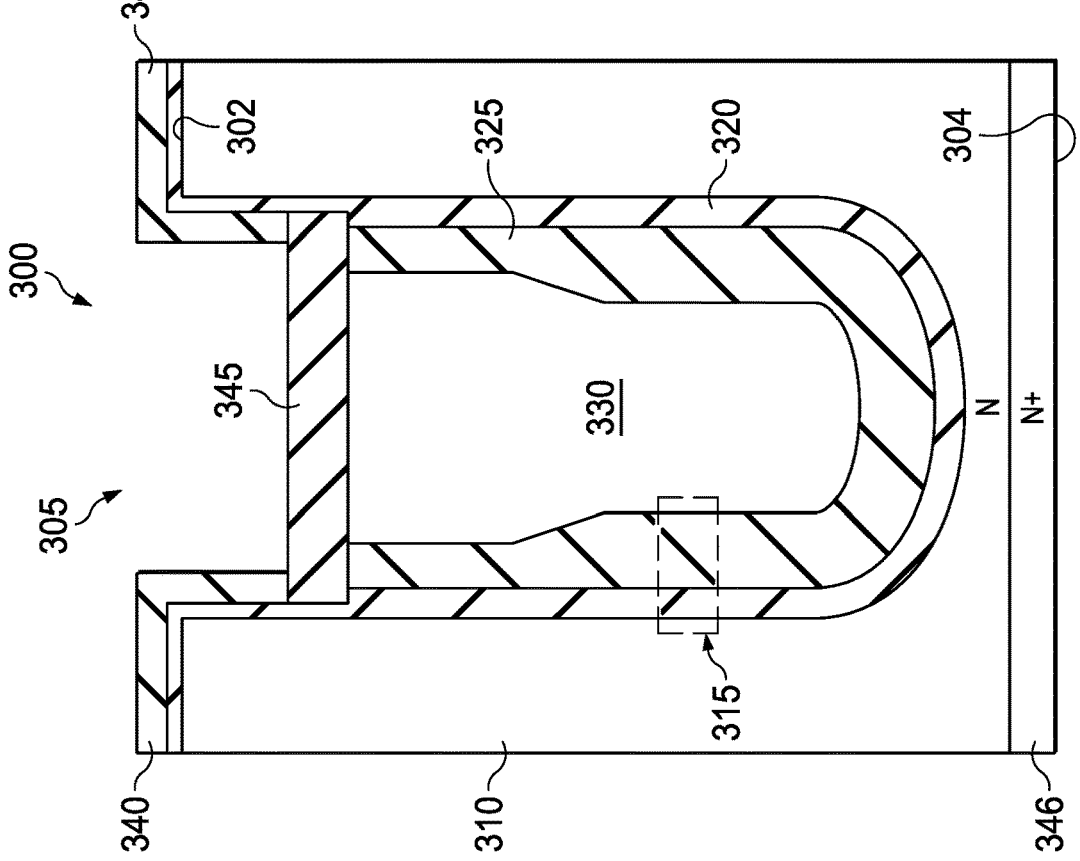
Figure 3O:
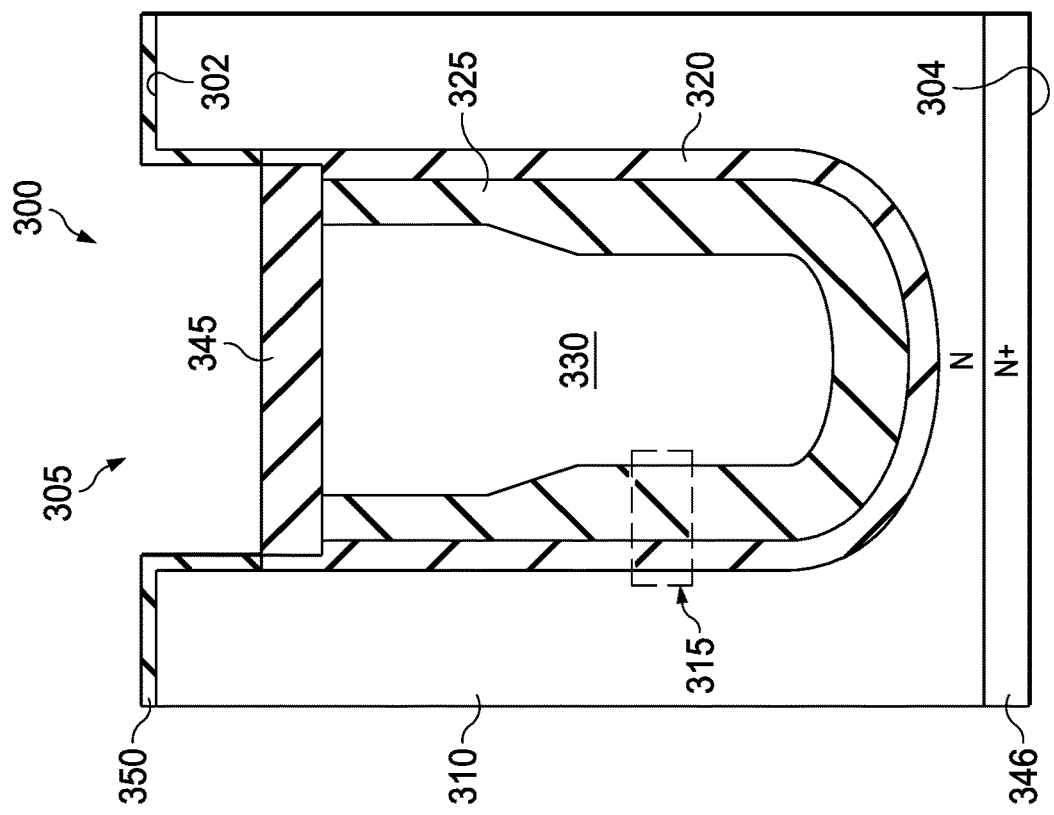
Figure 3N:
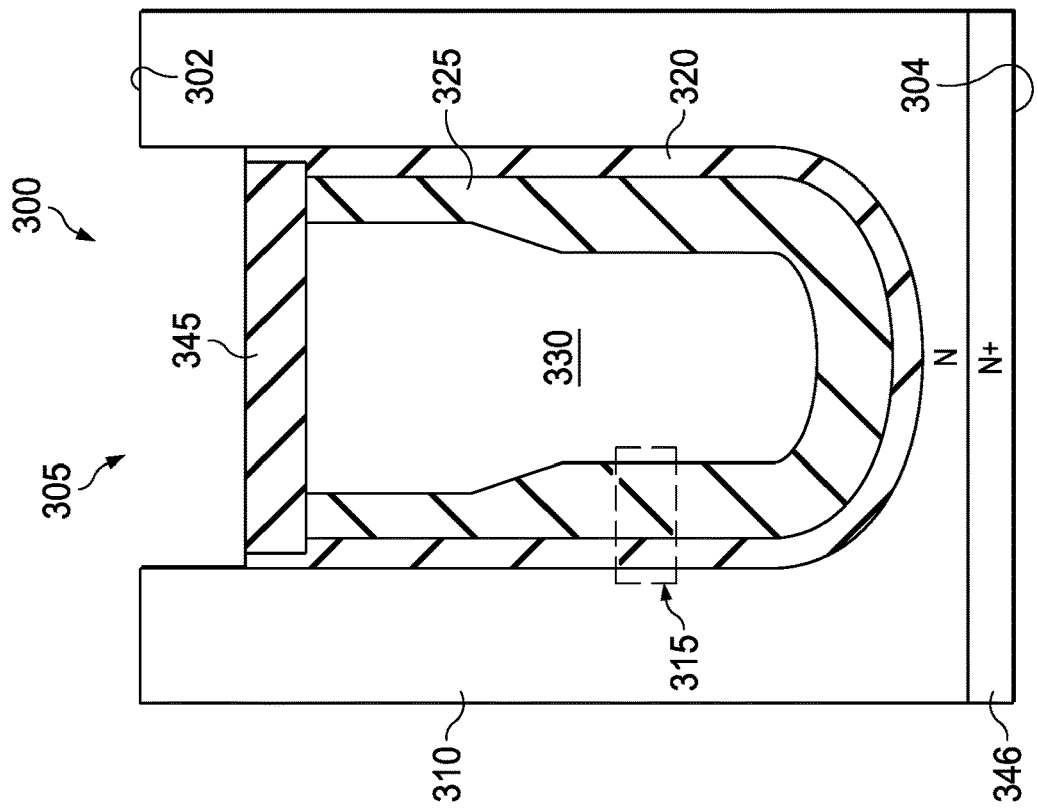
Figure 3Q:
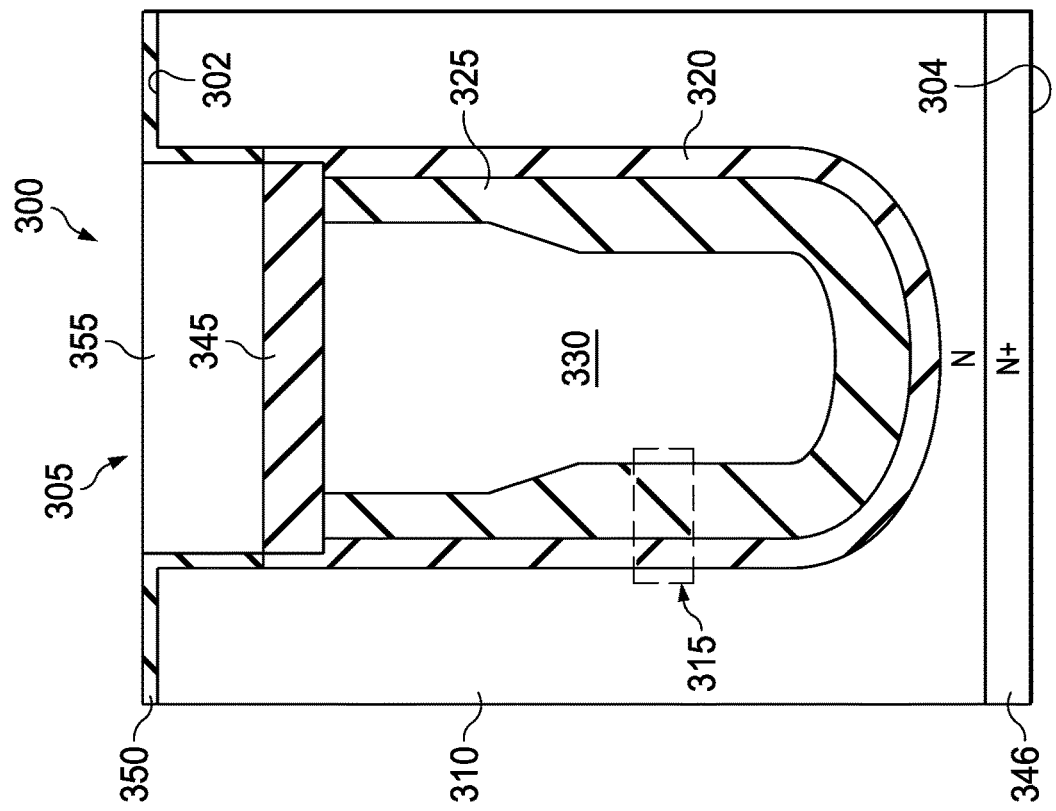
Figure 3P:
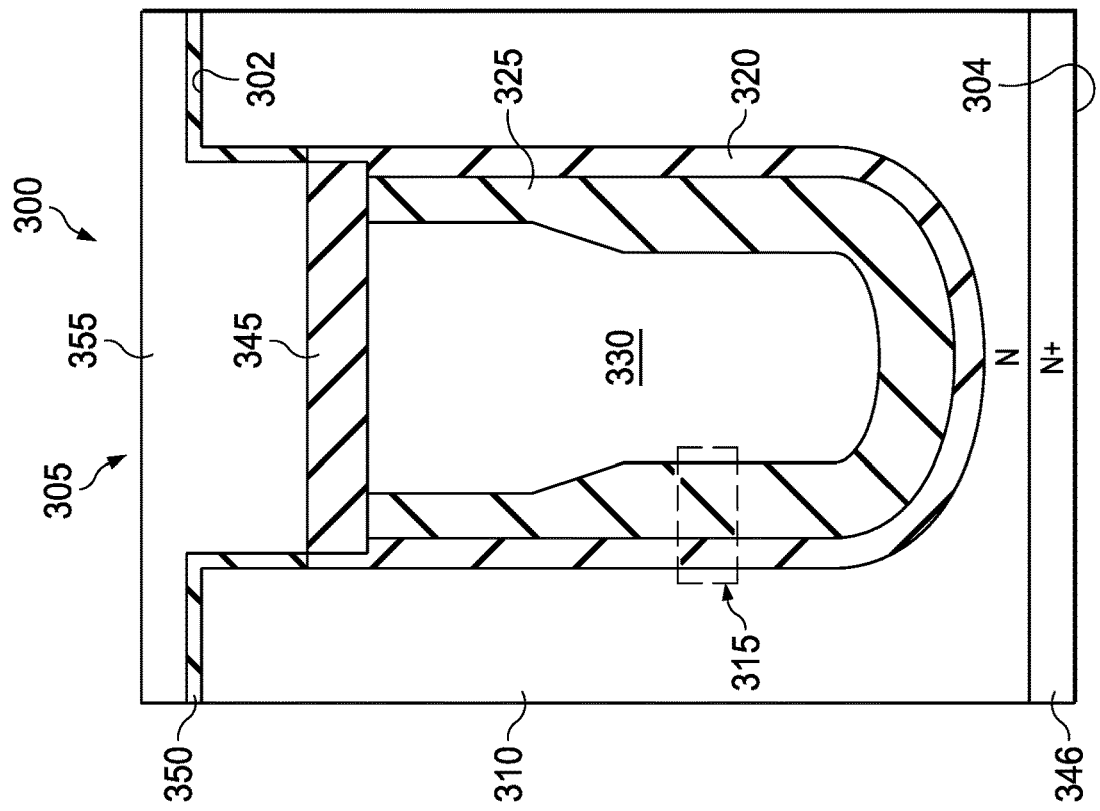
Figure 3S:
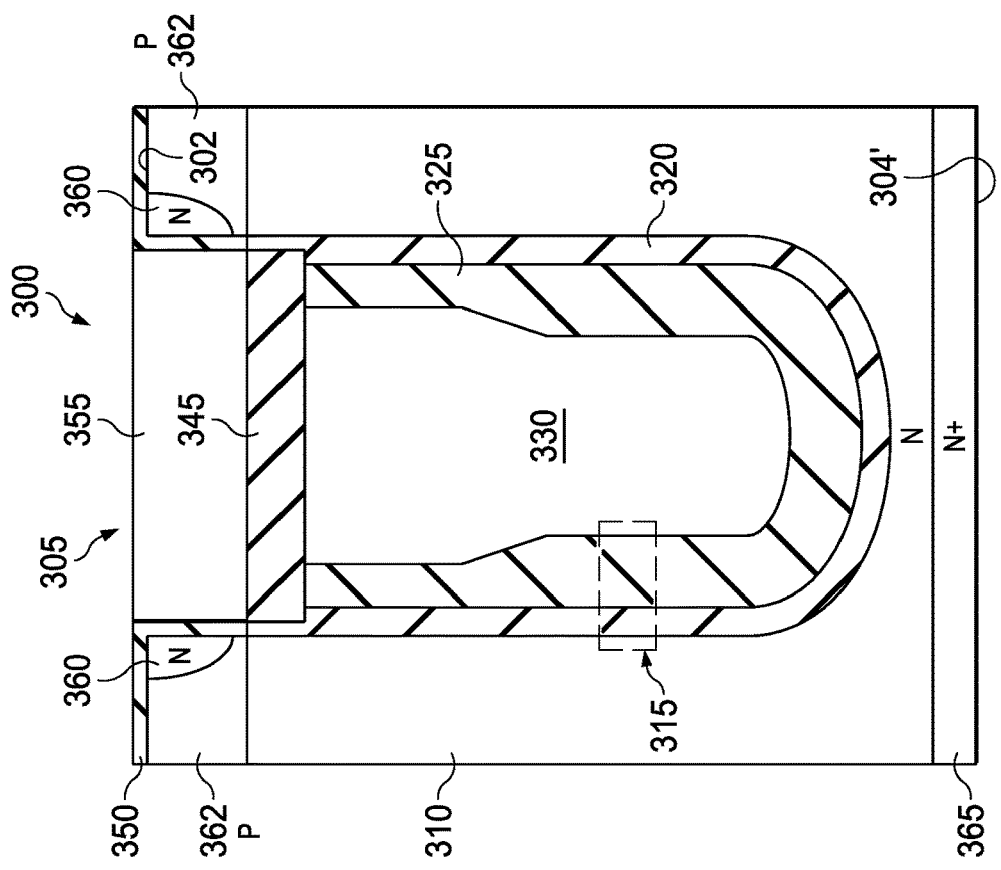

Turning now FIGS. 3A to 3S, illustrated are cross-sectional views of an example method of forming a semiconductor device 300. The method employs a local oxidation of silicon (LOCOS) process to construct the lateral insulator. LOCOS refers to a microfabrication process wherein silicon dioxide is formed in selected areas on a silicon wafer having a silicon/silicon dioxide interface at a lower point than the rest of the silicon surface. LOCOS generally employs a process of thermally growing silicon dioxide in a furnace, a pad/buffer layer followed by CVD of silicon nitride and a nitride mask. (It is noted that while stoichiometric silicon nitride has the empirical formula $Si_3N_4$, CVD silicon nitride may depart from this empirical formula, and may include several atomic percent hydrogen.) The silicon nitride layer (a protective layer) and silicon oxide layer (a pad layer) are etched. The lateral insulator is then thermally grown in the exposed area followed by removal of the nitride mask.

As introduced herein, a lateral insulator provides a higher level of isolation between a shield and a gate in a trench. A wet etch is used to partially remove oxide from upper sidewalls of the trench. A polysilicon soft etch is then used to smooth the shield polysilicon top surface. LOCOS with a thin pad, followed by silicon nitride, and then thick oxidation is employed on top of the shield polysilicon. Gate oxide is then grown followed by deposition of gate polysilicon to form the gate.

Referring initially to FIG. 3A, a trench 305 is formed in a substrate 310 (e.g., silicon substrate) extending from a top surface 302 thereof toward a bottom surface 304 of the substrate 310. An N+ layer 346 extends from the bottom surface 304 toward the top surface 302. The N+ layer 346 may be a portion of a heavily-doped N-type wafer below the trench 305. The substrate 310 above the N+ layer 346 may be an N-type epitaxial layer to serve as a drift region of the semiconductor device 300. The trench 305 may be 0.5 to 2 µm wide, for example, and may have aspect ratios of 3:1 to 10:1, for example. While the description that follows refers to a single trench 305 and related features, the principles as disclosed herein may apply to multiple trenches with the analogous structure(s) or otherwise to form the semiconductor device 300.

Turning now to FIG. 3B, a first liner (e.g., a (first) dielectric liner, (first) oxide liner) 320 is formed over the sidewalls of the trench 305 and a surface (e.g., the top surface 302) of the substrate 310. The first liner 320 of this example is formed by a thermal oxidation process at a temperature above 800° C., so that the first liner 320 includes primarily thermal silicon dioxide having a stoichiometric composition of silicon dioxide ($SiO_2$), and a hydrogen content less than five atomic percent. Such a thermally grown silicon dioxide layer may be referred to as "thermal oxide". The first liner 320 may have a thickness of 20 to 200 nm in the trench 305, for example.

Turning now to FIG. 3C, a second liner (e.g., a (second) dielectric liner, (second) oxide liner) 325 is formed over the first liner 320 in the trench 305. The second liner 325 may be formed by a chemical vapor deposition (CVD) process using tetraethyl orthosilicate TEOS, $Si(OC_2H_5)_4$, sometimes referred to as tetraethoxysilane. The CVD process may be implemented as a sub-atmospheric chemical vapor deposition (SACVD) process, for example, or as an atmospheric pressure chemical vapor deposition (APCVD) process. Alternatively, the second liner 325 may be formed by a plasma enhanced chemical vapor deposition (PECVD) process, using TEOS. Any dielectric layer formed from one of these processes may be referred to as "CVD oxide".

The second liner 325 may primarily include silicon dioxide. The second liner 325 may be formed at a temperature sufficiently low so that the second liner 325 has an etch rate, in aqueous buffered hydrofluoric acid, that is at least twice an etch rate, in the same aqueous buffered hydrofluoric acid, of the first liner 320. By way of example, the second liner 325 may be formed below 600° C. The second liner 325 may be formed to have a greater thickness proximate to bottom of the trench 305 than proximate the top of the trench 305, as depicted in FIG. 3C. The second liner 325 may be formed in two or more steps to attain a desired thickness profile in the trench 305. A combination of the first liner 320 and the second liner 325 provides or forms a shield liner 315 in the trench 305 having a wider lower portion and a narrower upper portion.

The second liner 325 is shown having a thicker portion toward the bottom of the trench 305 and a wider portion toward the top of the trench 305. This profile may be formed, e.g., by placing a material, such a photoresist with a lower etch rate than the second liner 325 material, in the bottom of the trench 305 and removing a portion of the exposed second liner 325 material, e.g., by aqueous buffered hydrofluoric acid. Additional details may be found in U.S. patent application Ser. No. 16/042,834 entitled "Semiconductor Device having Polysilicon Field Plate for Power MOSFETs" filed Jul. 23, 2018, incorporated herein by reference in its entirety. While in the illustrated example a portion of the second liner 325 remains over the first dielectric liner 320, in other implementations the second liner 325 may be completely removed over the first dielectric liner 320 in the wider (upper) portion of the trench 305. In such implementations the lower etch rate of the first liner 320 may allow the first liner 320 to act as an effective etch stop for the hydrofluoric acid etch process.

Turning now to FIG. 3D, a shield 330 is formed over the second liner 325 in the trench 305 extending to proximate to the top surface of the substrate 310. The shield 330 is electrically conductive, and is electrically isolated from the semiconductor material of the substrate 310 by the shield liner 315. The shield 330 may be formed by thermal or plasma decomposition of silane or disilane, so that the shield 330 may include primarily polycrystalline silicon, again sometimes referred to as polysilicon. By way of one example, the shield 330 may be formed of undoped polycrystalline silicon at 600° C. to 620° C., and subsequently implanted with dopants and annealed to provide a desired electrical resistivity in the shield 330. By way of another example, the shield 330 may be formed of doped polycrystalline silicon at 500° C. to 580° C. by including dopant reagents with the silane or disilane. The aforementioned features of the semiconductor device 300 are analogous to the like features of the semiconductor devices 100, 200 of FIGS. 1 and 2A to 2N. The shield 330 may be doped in situ or doped by ion implantation to result in a desired conductivity.

Turning now to FIG. 3E, a portion of the shield 330 is removed from the trench 305 exposing a portion of the second liner 325 employing an anisotropic plasma etch, for example. The anisotropic plasma etch may employ oxygen ($O_2$) plus fluoromethane ($CH_3F$) as an etchant. In implementations for which the second liner 325 is previously completely removed over the first liner 320 in the upper portion of the trench 305, the first liner 320 is exposed by the removal of the portion of the shield 330.

Turning now to FIG. 3F-1, the second liner 325, if present in the upper portion of the trench 305, is removed on exposed sidewalls of the trench 305 between the shield 330 and the top surface 302 exposing the first liner 320 above the polysilicon shield 330. Additionally, a portion of the first liner 320 is removed on the exposed sidewalls of the trench 305 and the surface of the substrate 310. The second liner 325 and portion of the first liner 320 may be removed by a wet chemical etch. If the first liner 320 is about 100 nm, as an example 70 nm may be removed via the wet chemical etch. A portion of the first liner 320 remains to protect top corners 307 of the trench 305. The corners 332 are exposed by partially removing the first liner 320 and the second liner 325 as set forth above.

Regarding FIG. 3F-2, illustrated is an alternative example, in which the second liner 325 is completely removed from the first liner 320 in the upper portion of the trench 305. In this example, a space between each of the corners 332 and the first liner 320 results from the relatively small amount of material removed from the first liner 320 by the wet chemical etch as compared to the example of FIG. 3F-1.

Turning now to FIG. 3G following FIG. 3F-1, a pad layer (e.g., a pad oxide layer) 335 is formed over, and optionally touching, the exposed portions of the shield 330, exposed portions of the second liner 325 and a section of exposed portions of the first liner 320 (after exposing the first liner 320 above the shield 330). The pad layer 335 may have a thickness of 10 to 50 nm in the trench 305, for example. The pad layer 335 of this example is formed by a thermal oxidation process at a temperature above 800° C., so that the pad layer 335 includes primarily thermal silicon dioxide having a stoichiometric composition of silicon dioxide.

Turning now to FIG. 3H, a protective layer (e.g., a protective nitride layer) 340 is formed over exposed portions of the semiconductor device 300 including in the trench 305 over exposed portions of the first liner 320 and the pad layer 335. The protective layer 340 may be a shield etch mask including hard mask materials, such as silicon nitride with a thickness of 20 nm to 100 nm.

Turning now to FIG. 3I, a portion of the protective layer 340 above the pad layer 335 is removed employing an anisotropic plasma etch, for example, providing an exposed portion of the pad layer 335. The anisotropic plasma etch may employ oxygen ($O_2$) plus fluoromethane ($CH_3F$) feedstock as an etchant.

Turning now to FIG. 3J, the exposed portion of the pad layer 335 above the shield 330 is removed employing an anisotropic plasma etch, for example. The anisotropic plasma etch may employ oxygen plus fluoromethane feedstock as an etchant.

Turning now to FIG. 3K, a portion of the shield 330 is removed (after removing the exposed pad layer 335) employing an isotropic soft plasma etch, for example. Thus, a top surface of the shield 330 is smoothed employing the isotropic soft plasma etch. In particular, relatively sharp features of the shield 330 are smoothed or removed by the isotropic soft plasma etch. Removing these features may reduce the opportunity to form high eclectic fields during operation that could reduce device reliability and/or lifetime. The isotropic soft plasma etch may employ oxygen plus carbon tetrafluoride as an etchant to also remove the portion of the shield 330 as illustrated.

Turning now to FIG. 3L, a lateral insulator (e.g., a lateral oxide insulator) 345 is formed over the shield 330 contacting a portion of the first liner 320 and the second liner 325. The lateral insulator 345 may have a thickness of 100 to 300 nm in the trench 305, for example. The lateral insulator 345 of this example is formed by a thermal oxidation process at a temperature above 900-1150° C., so that the lateral insulator 345 includes primarily thermal silicon dioxide having a stoichiometric composition of silicon dioxide. Because the thickness of the lateral insulator 345 is independent of the thickness of a gate dielectric layer 350 formed at a later stage of formation (see FIG. 3O, supra), the lateral insulator 345 may be formed with a thickness that advantageously provides improved voltage isolation between the shield 330 and a gate to be formed later thereover, relative to conventional similar devices.

Turning now to FIG. 3M, remaining portions of the protective layer 340 are removed (after forming the lateral insulator 345) leaving the exposed portions of the first liner 320 and the lateral insulator 345 in the trench 305. The remaining portions of the protective layer 340 are removed employing a wet chemical etch, for example. The wet chemical etch may employ phosphoric acid ($H_3PO_4$) as an etchant.

Turning now to FIG. 3N, the exposed portions of the first liner 320 on the surface of the substrate 310 and in the trench 305 between the lateral insulator 345 and the top surface 302 are removed employing, for example, a wet chemical etch using, for instance, hydrofluoric acid.

Turning now to FIG. 3O, a gate dielectric layer 350 is formed over the surface of the substrate 310 and the exposed sidewalls of the trench 305. The gate dielectric layer 350 may have a thickness of 10 to 50 nm, for example. The gate dielectric layer 350 of this example is formed by a thermal oxidation process at a temperature above 800° C., so that the gate dielectric layer 350 includes primarily thermal silicon dioxide having a stoichiometric composition of silicon dioxide. The lateral insulator 345 may have a minimum thickness at least two times thicker than a maximum thickness of the gate dielectric layer 350.

Turning now to FIG. 3P, a gate electrode 355 is formed over the gate dielectric layer 350 and the lateral insulator 345 in the trench 305. The gate electrode 355 may include polycrystalline silicon, and may be formed by thermal decomposition of silane or disilane, for example. The gate electrode 355 may be formed by a process similar to that used to form the shield 330.

Turning now to FIG. 3Q, portions of the gate electrode 355 are removed over the gate dielectric 350 on the surface of the substrate 310 and above the trench 305, e.g., employing an anisotropic plasma etch or chemical-mechanical polishing (CMP). The anisotropic plasma etch may employ oxygen ($O_2$) plus fluoromethane ($CH_3F$) as an etchant.

Figure 3R:
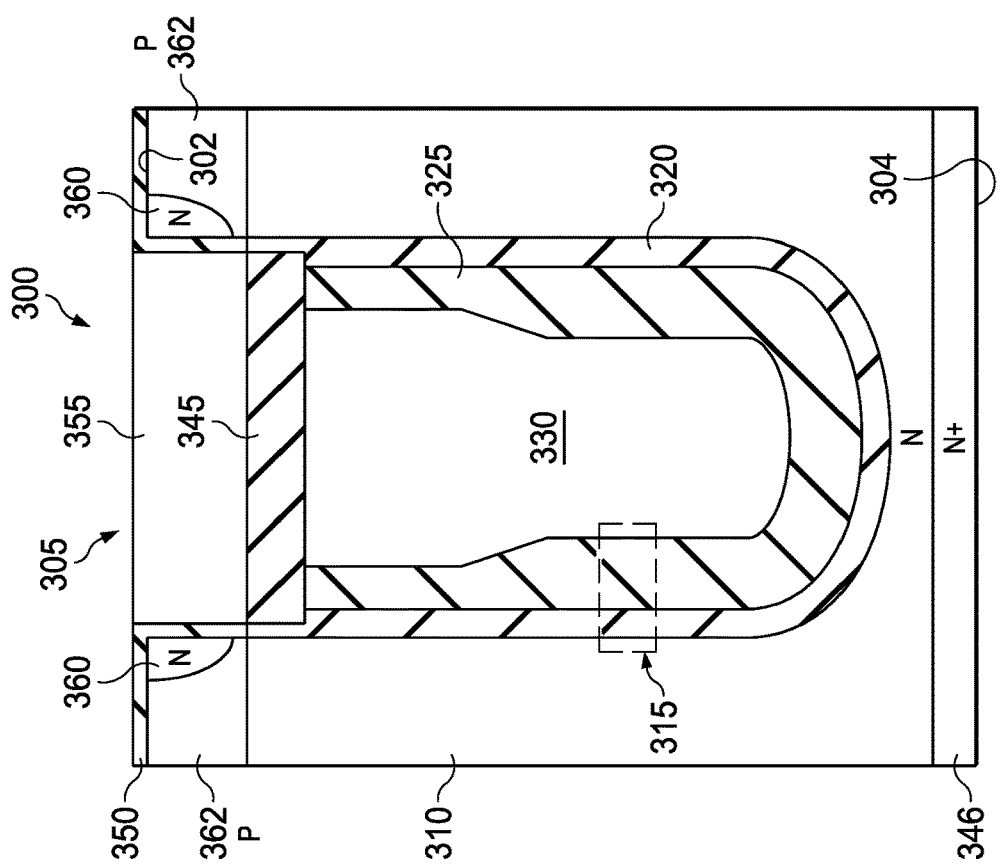

Turning now to FIG. 3R, source regions 360 and body regions 362 are formed (e.g., via an ion implant) in the substrate 310 on opposing sides of the gate electrode 355. The source regions 360 have a first conductivity type, for example, n-type. The body regions 362 have a second conductivity type, opposite from the first conductivity type; in this example, a p-type.

Turning now to FIG. 3S, a portion of the N+ layer 346 may be removed, e.g. by backgrinding, to produce a drain contact region 365 that extends to a new bottom surface 304'. A metal layer (not shown) may be formed on the surface 304' to form provide an ohmic connection to the drain contact region 365. Thus, if the source regions 360 are oriented toward the top surface 302 of the semiconductor device 300, the drain contact region 365 extends to the bottom surface 304' of the substrate 310. The drain contact region 365 has the first conductivity type, which is n-type in this example, and may be heavily doped. The semiconductor material of the substrate 310 between the body regions 362 and the drain contact region 365 may have the first conductivity type, n-type in this example, and may provide a drain drift region for the semiconductor device 300.

As a result of the processes and structures described hereinabove with thick oxide LOCOS in a trench between a conductive trench shield and a gate electrode, an improved semiconductor device consistent with the device 300 has been found to exhibit significantly reduced gate leakage current as compared to similar conventional devices. As an example, the improved semiconductor device exhibits two orders of magnitude of reduced gate leakage current at gate voltages of 10 volts and 20 volts compared to other similar conventional devices. The structure of the lateral insulator provides a high level of voltage isolation between the trench shield and the gate electrode in part by increasing at least partially removing the corners that result from the trench shield etchback (e.g., the corners 332, FIG. 3F), and by providing control of the lateral insulator thickness independent of the thickness of the gate dielectric layer.

With continuing reference to FIGS. 3A to 3S, an example semiconductor device 300 includes a trench 305 in a substrate 310 having a top surface 302 (see, e.g., FIG. 3A), and a shield 330 within the trench 305 (see, e.g., FIG. 3D). The semiconductor device 300 also includes a first liner 320 between a sidewall of the trench 305 and the shield 330 (see, e.g., FIG. 3B), and a second liner 325 between the first liner 320 and the shield 330 (see, e.g., FIG. 3C). The first liner 320 and the second liner 325 form a shield liner 315 having a wider lower portion and a narrower upper portion. The semiconductor device 300 also includes a lateral insulator 345 over the shield 330 contacting the first liner 320 (see, e.g., FIG. 3L).

The semiconductor device 300 also includes a gate dielectric layer 350 formed on exposed sidewalls of the trench 305 between the lateral insulator 345 and the top surface 302 (see, e.g., FIG. 3O). The lateral insulator 345 may have a minimum thickness at least two times thicker than a maximum thickness of the gate dielectric layer 350. The semiconductor device 300 also includes a gate electrode 355 over the gate dielectric layer 350 and the lateral insulator 345 in the trench 305 (see, e.g., FIG. 3P), as well as source regions 360 and body regions 362 in the substrate 310 on opposing sides of the gate electrode 355 (see, e.g., FIG. 3R). The semiconductor device 300 also includes a drain contact region 365 with an opposing surface (the bottom surface 304') of the substrate 310 from the source regions 360 (see, e.g., FIG. 3S).

With continuing reference to FIGS. 3A to 3S, an example method of forming a semiconductor device 300 includes forming the trench 305 in the substrate 310 having the top surface 302 (see, e.g., FIG. 3A), forming the first (dielectric) liner 320 over sidewalls of the trench 305 (see, e.g., FIG. 3B), and forming the shield 330 over a second (dielectric) liner 325 (see, e.g., FIG. 3D). The first liner 320 and the second liner 325 may form a shield liner 315 having a wider lower portion and a narrower upper portion. (See, e.g., FIG. 3C.) The method also includes removing a portion of the polysilicon shield 330 (see, e.g., FIG. 3E), and forming the lateral insulator 345 over the polysilicon shield 330 contacting the first liner 320 (see, e.g., FIG. 3L). The method also includes removing the first liner 320 between the lateral insulator 345 and the top surface 302 providing an exposed sidewall(s) of the trench 305 (see, e.g., FIG. 3N), and forming the gate dielectric layer 350 over the exposed sidewall(s) of the trench 305 (see, e.g., FIG. 3O). The lateral insulator 345 may have a minimum thickness at least two times thicker than a maximum thickness of the gate dielectric layer 350.

With respect to forming the lateral insulator 345 the method may include forming the pad layer 335 over the polysilicon shield 330 (see, e.g., FIG. 3G), and forming the protective layer 340 over the first liner 320 (see, e.g., FIG. 3H). The method further includes removing the pad layer 335 by a process selective to the protective layer 340 (see, e.g., FIG. 3J), and removing a portion of the polysilicon shield 330 (see, e.g., FIG. 3K).

The method also includes forming the gate electrode 355 over the gate dielectric layer 350 and the lateral insulator 345 in the trench 305 (see, e.g., FIG. 3P), and forming source regions 360 in the substrate 310 on opposing sides of the gate electrode 355 (see, e.g., FIG. 3R). The method further includes forming a drain contact region 365 extending from the bottom surface 304' of the substrate 310 toward the top surface 302. (See, e.g., FIG. 3S.)

For a better understanding of semiconductor devices that may employ a lateral insulator as described herein and/or vertical metal oxide semiconductor transistors, see U.S. patent application Ser. No. 16/546,499 entitled "Trench Shield Isolation Layer" filed Aug. 21, 2019, which is incorporated herein by reference.

It is noted that terms such as top, bottom, over, and below may be used in this disclosure. These terms should not be construed as limiting the position or orientation of a structure or element, but should be used to provide spatial relationship between structures or elements.

Thus, a semiconductor device including a lateral insulator, and related methods of forming the same, has been introduced. It should be understood that the previously described examples of the semiconductor device, and related methods, are submitted for illustrative purposes only and that other examples that facilitate low gate leakage current between the gate and shield of the semiconductor device are well within the scope of the present disclosure.

Although the present disclosure has been described in detail, various changes, substitutions and alterations may be made without departing from the spirit and scope of the disclosure in its broadest form.

Moreover, the scope of the present application is not intended to be limited to the particular examples of the process, machine, manufacture, composition of matter, means, methods and steps described in the specification. The processes, machines, manufacture, compositions of matter, means, methods, or steps, presently existing or later to be developed, that perform substantially the same function or achieve substantially the same result as the corresponding examples described herein may be utilized according to the present disclosure. Accordingly, the appended claims are intended to include within their scope such processes, machines, manufacture, compositions of matter, means, methods, or steps.

What is claimed is:

1. A method of forming a semiconductor device, comprising:
   forming a trench in a substrate having a top surface;
   forming a first dielectric liner over sidewalls of the trench;
   forming a second dielectric liner over the first dielectric liner;
   forming a polysilicon shield over the second dielectric liner;
   removing a portion of the polysilicon shield;
   forming a lateral insulator over the polysilicon shield contacting the first dielectric liner;

removing the first dielectric liner between the lateral insulator and the top surface providing an exposed sidewall of the substrate; and forming a gate dielectric layer over the exposed sidewall of the substrate.

2. The method as recited in claim 1 further comprising removing a portion of the second dielectric liner after removing the portion of the polysilicon shield, thereby exposing the first dielectric liner.

3. The method as recited in claim 1 further comprising forming a pad layer over the polysilicon shield and a section of exposed portions of the first dielectric liner after exposing the first dielectric liner above the polysilicon shield.

4. The method as recited in claim 3 further comprising forming a protective layer over the pad layer and the exposed portions of the first dielectric liner.

5. The method as recited in claim 4 further comprising removing a portion of the protective layer providing an exposed pad layer.

6. The method as recited in claim 5 further comprising removing the exposed pad layer thereby exposing the polysilicon shield.

7. The method as recited in claim 6 further comprising removing a portion of the polysilicon shield after removing the exposed pad layer.

8. The method as recited in claim 7 further comprising removing remaining portions of the protective layer after forming the lateral insulator.

9. The method as recited in claim 1 wherein the lateral insulator has a minimum thickness at least two times thicker than a maximum thickness of the gate dielectric layer.

10. The method as recited in claim 1 further comprising:
a gate electrode over the gate dielectric layer and the lateral insulator in the trench;
forming source regions in the substrate on opposing sides of the gate electrode; and
forming a drain contact region below the trench.

11. A semiconductor device, comprising:
a trench in a substrate having a top surface;
a shield within the trench;
a first liner between a sidewall of the trench and the shield;
a lateral insulator over the shield contacting the first liner; and
a gate dielectric layer on a sidewall of the trench between the lateral insulator and the top surface, the lateral insulator having a minimum thickness at least two times thicker than a maximum thickness of the gate dielectric layer.

12. The semiconductor device as recited in claim 11 further comprising a second liner between the first liner and the shield.

13. The semiconductor device as recited in claim 12 wherein the first liner comprises thermal oxide and the second liner comprises a CVD oxide.

14. The semiconductor device as recited in claim 13 wherein the first liner and the second liner form a shield liner having a wider lower portion and a narrower upper portion.

15. The semiconductor device as recited in claim 11 further comprising:
a gate electrode over the gate dielectric layer and the lateral insulator in the trench;
source regions in the substrate on opposing sides of the gate electrode; and
a drain contact region below the trench.

16. A method of forming a semiconductor device, comprising:
forming a trench in a substrate having a top surface;
forming a dielectric liner over sidewalls of the trench;
forming a polysilicon shield over the dielectric liner;
removing a portion of the polysilicon shield exposing the dielectric liner;
forming a lateral insulator over the polysilicon shield contacting the dielectric liner;
removing the dielectric liner between the lateral insulator and the top surface providing an exposed sidewall of the trench; and
forming a gate dielectric layer over the exposed sidewall of the trench.

17. The method as recited in claim 16 wherein forming the lateral insulator includes:
forming a pad oxide layer over the polysilicon shield;
forming a protective nitride layer over the dielectric liner;
removing the pad oxide layer by a process selective to the protective nitride layer; and
removing a portion of the polysilicon shield.

18. The method as recited in claim 16 wherein the lateral insulator has a minimum thickness at least two times thicker than a maximum thickness of the gate dielectric layer.

19. The method as recited in claim 16 wherein the dielectric liner is a first dielectric liner and further comprising forming a second dielectric liner over the first dielectric liner, the first dielectric liner and the second dielectric liner forming a shield liner having a wider lower portion and a narrower upper portion.

20. The method as recited in claim 16, further comprising:
forming a gate electrode over the gate dielectric layer and the lateral insulator in the trench;
forming source regions in the substrate on opposing sides of the gate electrode; and
forming a drain contact region below the trench.

* * * * *